(12) United States Patent
Ueda

(10) Patent No.: US 12,268,049 B2
(45) Date of Patent: Apr. 1, 2025

(54) DISPLAY UNIT WITH ORGANIC LAYER

(71) Applicant: SONY CORPORATION, Tokyo (JP)

(72) Inventor: Daisuke Ueda, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 18/535,809

(22) Filed: Dec. 11, 2023

(65) Prior Publication Data

US 2024/0138182 A1 Apr. 25, 2024
US 2024/0237394 A9 Jul. 11, 2024

Related U.S. Application Data

(63) Continuation of application No. 17/988,124, filed on Nov. 16, 2022, now Pat. No. 11,871,611, which is a
(Continued)

(30) Foreign Application Priority Data

Oct. 9, 2014 (JP) .................................. 2014-208116

(51) Int. Cl.
*H10K 50/856* (2023.01)
*H10K 50/824* (2023.01)
(Continued)

(52) U.S. Cl.
CPC ......... *H10K 50/856* (2023.02); *H10K 50/824* (2023.02); *H10K 59/122* (2023.02); *H10K 71/00* (2023.02); *H10K 59/38* (2023.02)

(58) Field of Classification Search
CPC .. H10K 50/856; H10K 50/824; H10K 59/122; H10K 71/00; H10K 59/38
See application file for complete search history.

(56) References Cited

U.S. PATENT DOCUMENTS

| 4,317,086 A | 2/1982 | Scifres et al. |
| 4,894,034 A | 1/1990 | Brown, III |
(Continued)

FOREIGN PATENT DOCUMENTS

| CN | 1363200 A | 8/2002 |
| CN | 1645979 A | 7/2005 |
(Continued)

OTHER PUBLICATIONS

Non-Final Office Action for U.S. Appl. No. 16/369,307, issued on Apr. 24, 2019, 13 pages.
(Continued)

*Primary Examiner* — Caleb E Henry
(74) *Attorney, Agent, or Firm* — K&L Gates LLP

(57) ABSTRACT

A display unit includes a plurality of pixels, a reflector layer, and an auxiliary electrode. Each of the plurality of pixels has a first electrode, an organic layer, and a second electrode in this order. The organic layer and the second electrode are provided on the first electrode. The organic layer includes a light-emitting layer. The reflector layer has a light-reflecting surface around each of the pixels. The auxiliary electrode is provided on the reflector layer and is projected from an upper end of the light-reflecting surface. The auxiliary electrode has a portion which is exposed from the organic layer, and the exposed portion is covered with the second electrode.

11 Claims, 21 Drawing Sheets

Related U.S. Application Data continuation of application No. 17/038,855, filed on Sep. 30, 2020, now Pat. No. 11,563,198, which is a continuation of application No. 16/682,135, filed on Nov. 13, 2019, now Pat. No. 10,826,023, which is a continuation of application No. 16/369,307, filed on Mar. 29, 2019, now Pat. No. 10,497,903, which is a continuation of application No. 15/512,572, filed as application No. PCT/JP2015/076244 on Sep. 16, 2015, now Pat. No. 10,290,832.

(51) Int. Cl.
  *H10K 59/122* (2023.01)
  *H10K 59/38* (2023.01)
  *H10K 71/00* (2023.01)

(56) References Cited

U.S. PATENT DOCUMENTS

| | | |
|---|---|---|
| 5,803,579 A | 9/1998 | Turnbill et al. |
| 5,841,128 A | 11/1998 | Shibuya et al. |
| 5,930,279 A | 7/1999 | Apollonov et al. |
| 6,208,395 B1* | 3/2001 | Kanoh ............... G02F 1/133553 349/41 |
| 6,635,901 B2 | 10/2003 | Sawaki et al. |
| 6,869,635 B2 | 3/2005 | Kobayashi |
| 7,091,658 B2 | 8/2006 | Ito et al. |
| 7,135,711 B2 | 11/2006 | Linder et al. |
| 7,242,140 B2 | 7/2007 | Kobayashi |
| 7,271,535 B2 | 9/2007 | Kobayashi |
| 7,279,833 B2 | 10/2007 | Adachi et al. |
| 7,492,092 B2 | 2/2009 | Yamauchi |
| 7,538,485 B2 | 5/2009 | Murayama |
| 7,652,423 B2 | 1/2010 | Kobayashi |
| 7,692,186 B2 | 4/2010 | Yamazaki et al. |
| 7,719,013 B2 | 5/2010 | Lee |
| 7,834,370 B2 | 11/2010 | Koya et al. |
| 7,903,210 B2* | 3/2011 | Sugiura ............... G02F 1/133553 349/114 |
| 7,982,392 B2 | 7/2011 | Ito |
| 8,022,419 B2 | 9/2011 | Yasuda et al. |
| 8,058,082 B2 | 11/2011 | Yu et al. |
| 8,058,663 B2 | 11/2011 | Fan et al. |
| 8,272,757 B1 | 9/2012 | Fan et al. |
| 8,288,646 B2* | 10/2012 | Kumar ............... H01L 31/068 136/255 |
| 8,299,702 B2 | 10/2012 | Choi et al. |
| 8,354,788 B2 | 1/2013 | Okinaka et al. |
| 8,665,403 B2* | 3/2014 | Yamazaki ............ G02F 1/133553 349/114 |
| 8,878,167 B2 | 11/2014 | Jun et al. |
| 8,884,281 B2 | 11/2014 | Ohuchi et al. |
| 9,082,668 B2* | 7/2015 | Kim ............... H01L 27/1262 |
| 10,290,832 B2* | 5/2019 | Ueda ............... H10K 71/00 |
| 10,497,903 B2* | 12/2019 | Ueda ............... H10K 71/00 |
| 10,826,023 B2* | 11/2020 | Ueda ............... H10K 59/878 |
| 11,563,198 B2* | 1/2023 | Ueda ............... H10K 71/00 |
| 2002/0011783 A1 | 1/2002 | Hosokawa |
| 2002/0140886 A1* | 10/2002 | Sugiura ............ G02F 1/133553 349/113 |
| 2002/0180369 A1 | 12/2002 | Koyama |
| 2003/0087467 A1 | 5/2003 | Oohata et al. |
| 2004/0113550 A1 | 6/2004 | Adachi et al. |
| 2004/0213017 A1 | 10/2004 | Chou et al. |
| 2004/0238834 A1 | 12/2004 | Yasuoka et al. |
| 2005/0023550 A1 | 2/2005 | Eliashevich et al. |
| 2005/0127828 A1 | 6/2005 | Chung et al. |
| 2005/0179044 A1 | 8/2005 | Oohata et al. |
| 2005/0254243 A1 | 11/2005 | Jiang et al. |
| 2006/0102912 A1 | 5/2006 | Abe et al. |
| 2006/0175621 A1 | 8/2006 | Ohtsuka et al. |
| 2006/0180818 A1 | 8/2006 | Nagai et al. |
| 2006/0214173 A1 | 9/2006 | Beeson et al. |
| 2006/0232195 A1 | 10/2006 | Cok et al. |
| 2007/0013293 A1 | 1/2007 | Cok |
| 2007/0176188 A1 | 8/2007 | Tanaka et al. |
| 2007/0190676 A1 | 8/2007 | Chu et al. |
| 2007/0215878 A1 | 9/2007 | Wuu et al. |
| 2007/0262323 A1 | 11/2007 | Sonobe et al. |
| 2007/0278502 A1 | 12/2007 | Shakuda et al. |
| 2008/0100020 A1 | 5/2008 | Ito |
| 2008/0100209 A1 | 5/2008 | Ito |
| 2008/0142814 A1 | 6/2008 | Chu et al. |
| 2008/0145931 A1 | 6/2008 | Horio et al. |
| 2008/0149945 A1 | 6/2008 | Nagai |
| 2008/0149946 A1 | 6/2008 | Kim et al. |
| 2008/0237622 A1 | 10/2008 | Choi et al. |
| 2008/0251796 A1 | 10/2008 | Lee et al. |
| 2008/0251808 A1 | 10/2008 | Kususe et al. |
| 2008/0258156 A1 | 10/2008 | Hata |
| 2008/0287028 A1* | 11/2008 | Ozawa ............... H10K 71/00 445/24 |
| 2009/0009069 A1* | 1/2009 | Takata ............... H10K 59/122 445/24 |
| 2009/0085048 A1 | 4/2009 | Lee et al. |
| 2009/0121241 A1 | 5/2009 | Keller et al. |
| 2009/0212318 A1 | 8/2009 | Fudeta et al. |
| 2009/0242910 A1 | 10/2009 | Murofushi et al. |
| 2009/0267085 A1 | 10/2009 | Lee et al. |
| 2009/0278454 A1 | 11/2009 | Fedorovskaya et al. |
| 2010/0013379 A1 | 1/2010 | Park |
| 2010/0032696 A1 | 2/2010 | Yu et al. |
| 2011/0140135 A1 | 6/2011 | Lee et al. |
| 2011/0284903 A1 | 11/2011 | Loh et al. |
| 2012/0018749 A1 | 1/2012 | Lee et al. |
| 2012/0205700 A1 | 8/2012 | Tanada et al. |
| 2013/0256638 A1* | 10/2013 | Uesugi ............... H10K 59/131 438/34 |
| 2014/0151651 A1* | 6/2014 | Jin ............... H10K 50/852 438/23 |
| 2014/0197395 A1 | 7/2014 | Ariyoshi et al. |
| 2015/0021571 A1* | 1/2015 | Yamakita ............ H10K 59/1315 438/34 |
| 2015/0097168 A1* | 4/2015 | Hanawa ............... H10K 50/856 257/40 |
| 2015/0108512 A1* | 4/2015 | Shimayama ........ H10K 50/8428 257/88 |
| 2015/0144902 A1 | 5/2015 | Do et al. |
| 2016/0293878 A1* | 10/2016 | Maruyama ........... H10K 50/824 |
| 2017/0288174 A1* | 10/2017 | Ueda ............... H10K 50/824 |
| 2019/0129269 A1* | 5/2019 | Ogawa ............. G02F 1/136286 |
| 2019/0229293 A1* | 7/2019 | Ueda ............... H10K 59/122 |
| 2020/0083483 A1* | 3/2020 | Ueda ............... H10K 59/80522 |
| 2020/0185638 A1* | 6/2020 | Choi ............... H10K 59/122 |
| 2021/0013451 A1* | 1/2021 | Ueda ............... H10K 50/856 |
| 2022/0140293 A1* | 5/2022 | Xia ............... H10K 59/8792 257/89 |
| 2022/0209194 A1* | 6/2022 | Kim ............... H10K 50/824 |
| 2022/0320472 A1* | 10/2022 | Tabatake ............ H10K 50/824 |
| 2023/0083513 A1* | 3/2023 | Ueda ............... H10K 50/824 257/40 |

FOREIGN PATENT DOCUMENTS

| | | |
|---|---|---|
| DE | 112012000766 T5 | 2/2014 |
| EP | 1191820 A | 3/2002 |
| JP | 11-214161 A | 8/1999 |
| JP | 2001-230086 A | 8/2001 |
| JP | 2002-260846 A | 9/2002 |
| JP | 2005-166662 A | 6/2005 |
| JP | 2005-228751 A | 8/2005 |
| JP | 2008-010275 A | 1/2008 |
| JP | 2012-182121 A | 9/2012 |
| JP | 2013-191533 A | 9/2013 |
| KR | 10-2007-0087082 A | 8/2007 |
| KR | 10-2014-0048087 A | 4/2014 |
| TW | 200529698 A | 9/2005 |

(56) References Cited

FOREIGN PATENT DOCUMENTS

| TW | 201248962 A | 12/2012 |
|---|---|---|
| WO | 2012/108366 A1 | 8/2012 |

OTHER PUBLICATIONS

Notice of Allowance for U.S. Appl. No. 16/369,307, issued on Aug. 12, 2019, 8 pages.
Non-Final Office Action for U.S. Appl. No. 15/512,572, issued on Jun. 27, 2018, 13 pages.
Notice of Allowance for U.S. Appl. No. 15/512,572, issued on Jan. 4, 2019, 7 pages.
International Preliminary Report on Patentability of PCT Application No. PCT/JP2015/076244, issued on Apr. 20, 2017, 4 pages of English Translation and 8 pages of IPRP.
International Search Report and Written Opinion of PCT Application No. PCT/JP2015/076244, issued on Dec. 15, 2015, 8 pages of translation and 7 pages of ISRWO.

* cited by examiner

[FIG. 1A]
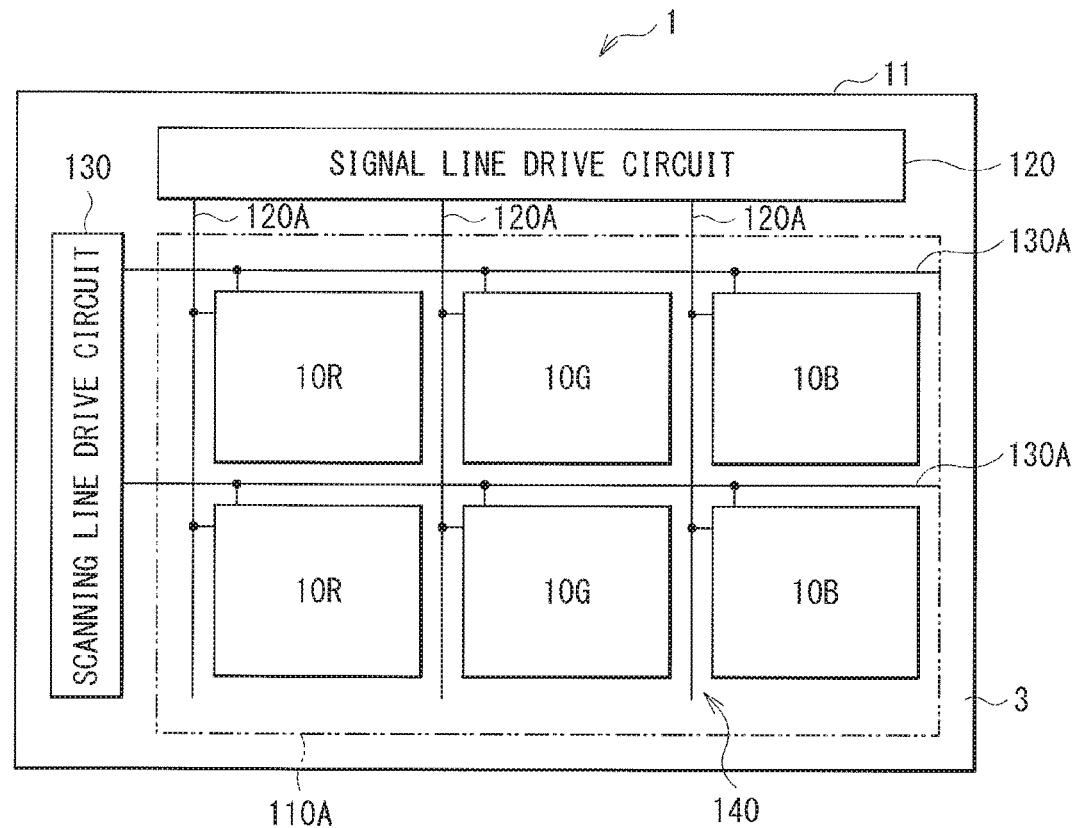
[FIG. 1B]
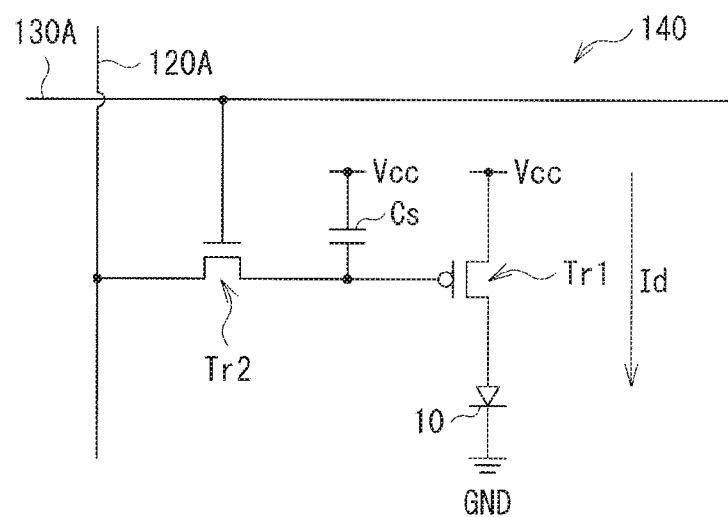

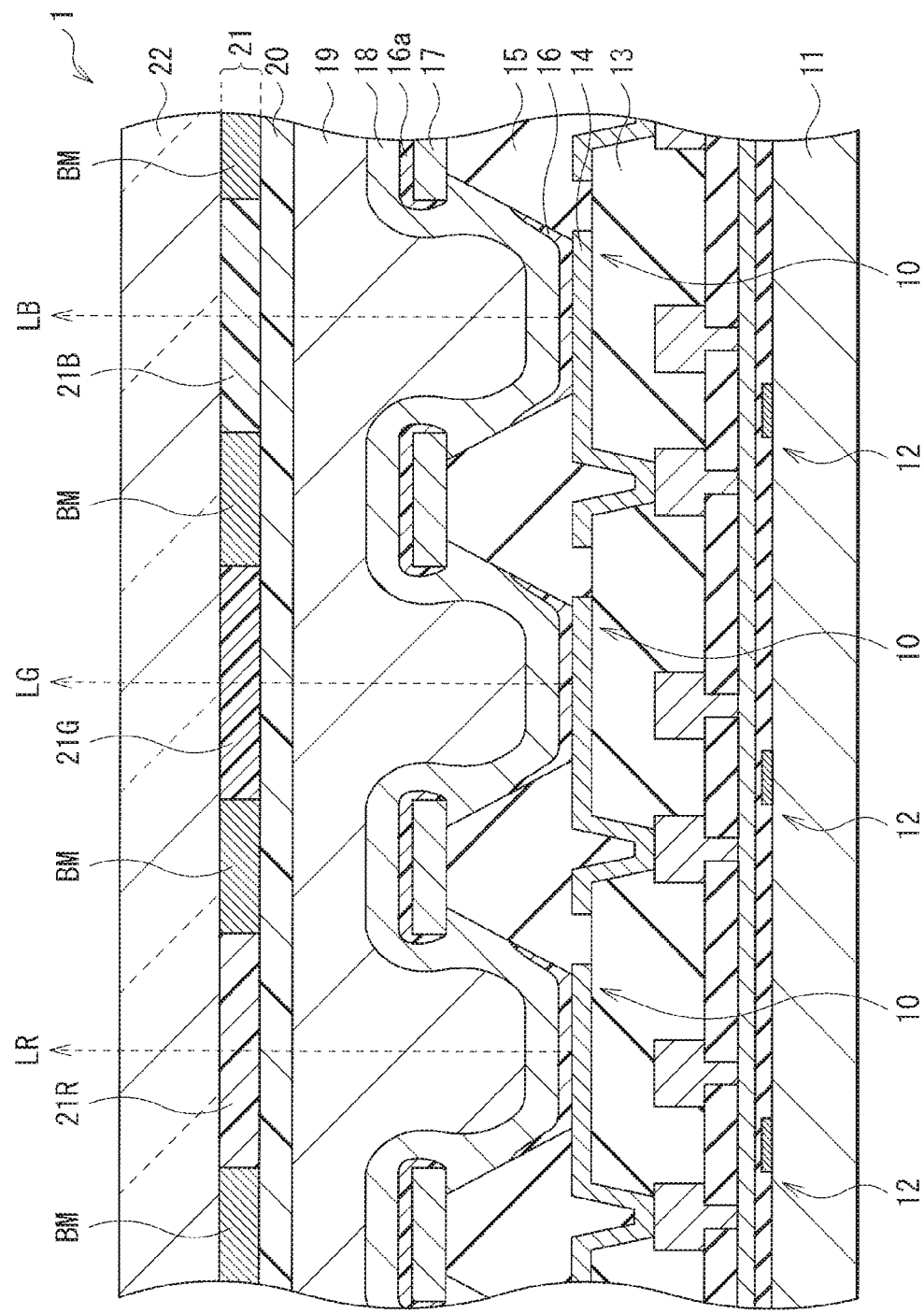
[FIG. 2]

[FIG. 3]
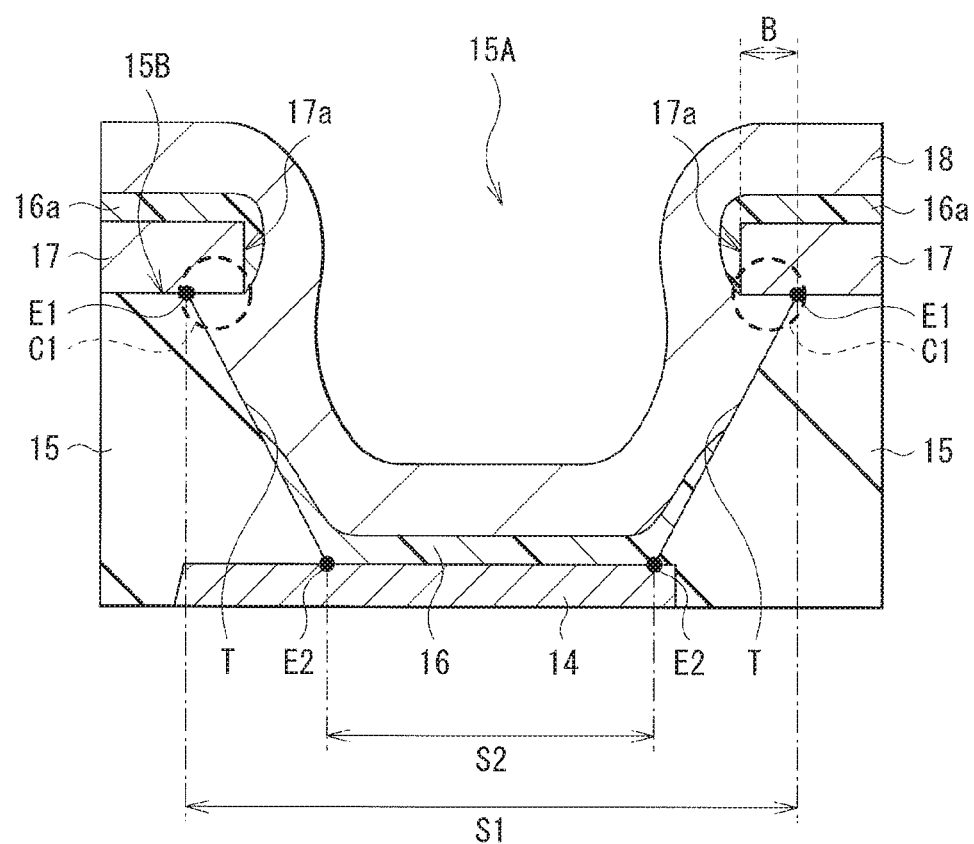

[FIG. 4A]
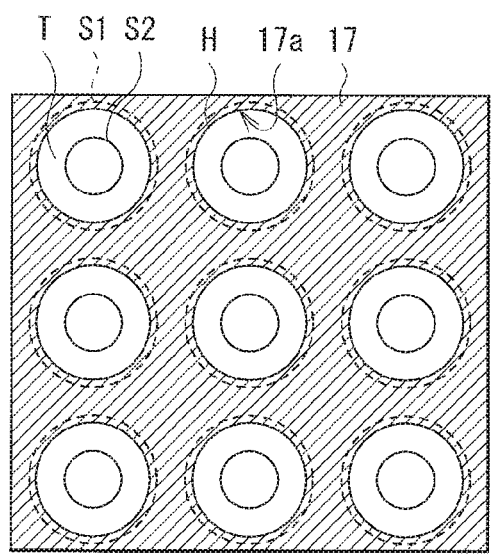
[FIG. 4B]
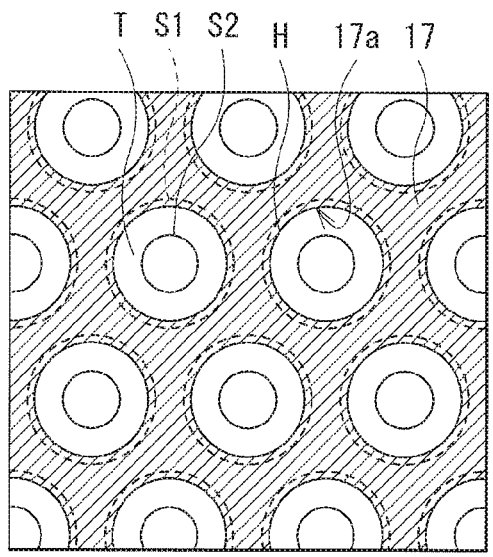

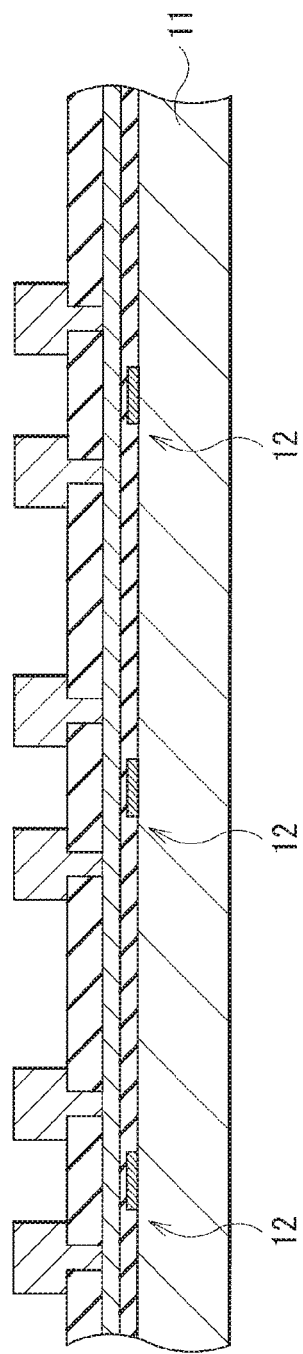
[FIG. 5A]

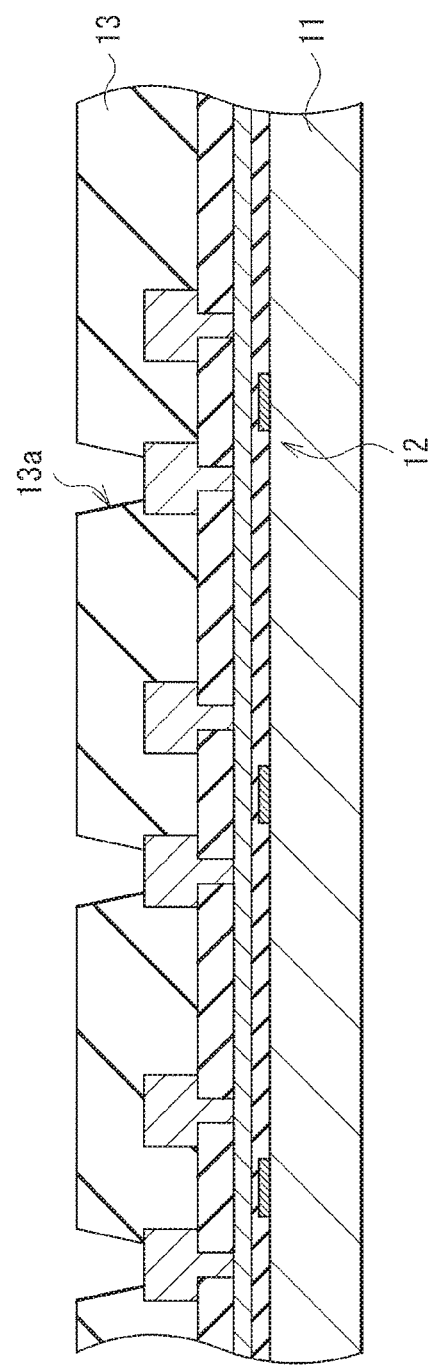
[FIG. 5B]

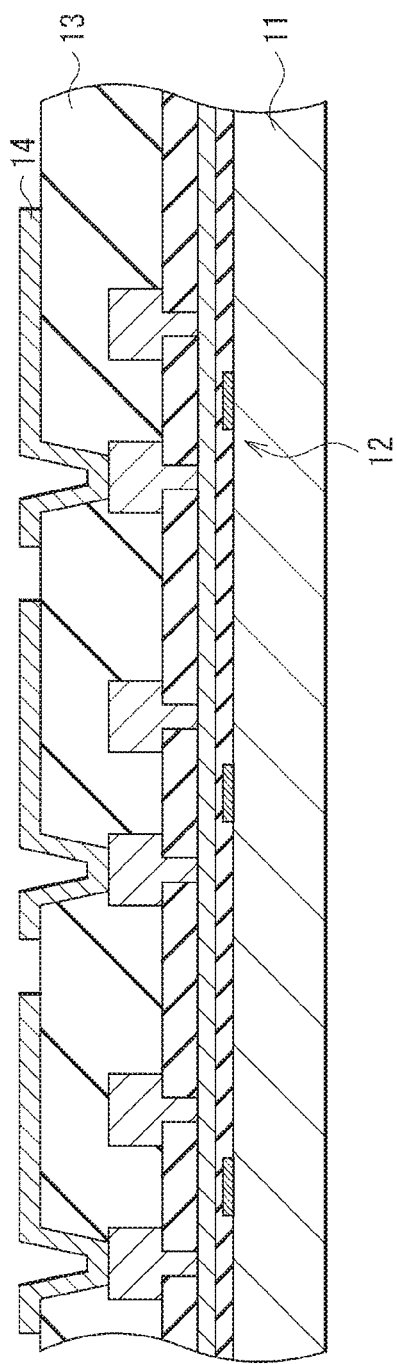
[FIG. 5C]

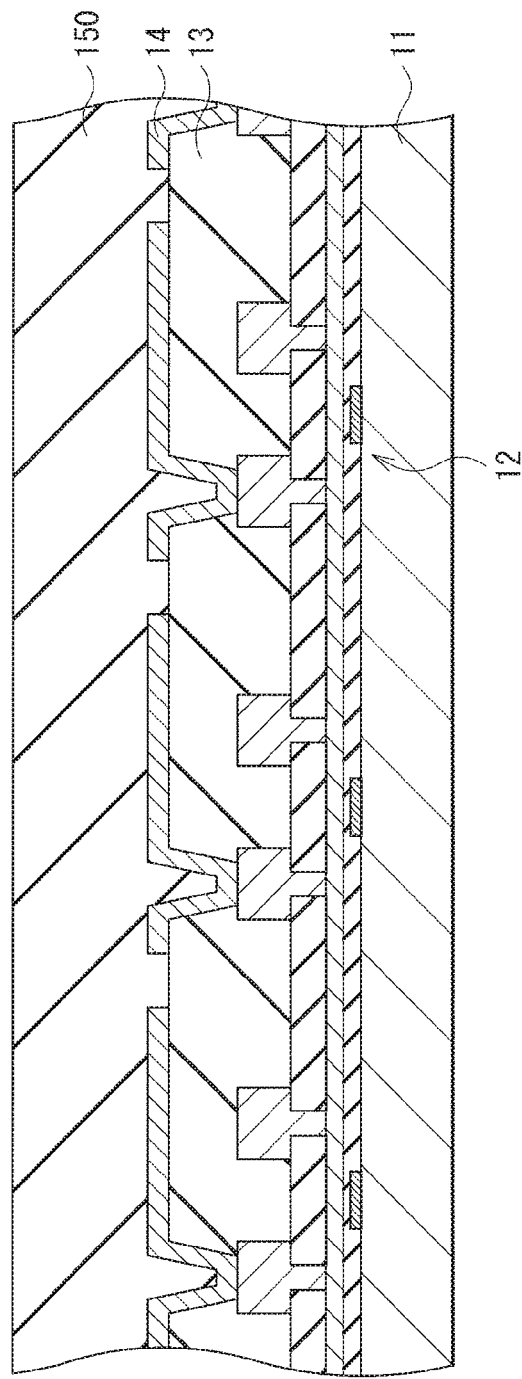
[FIG. 5D]

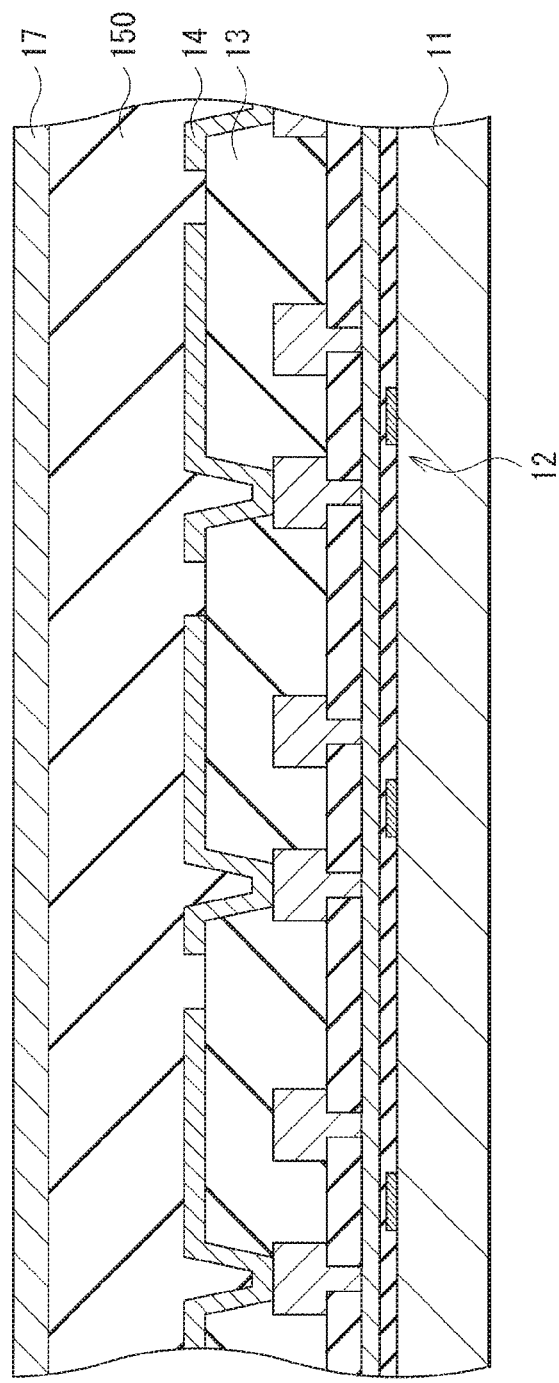
[FIG. 5E]

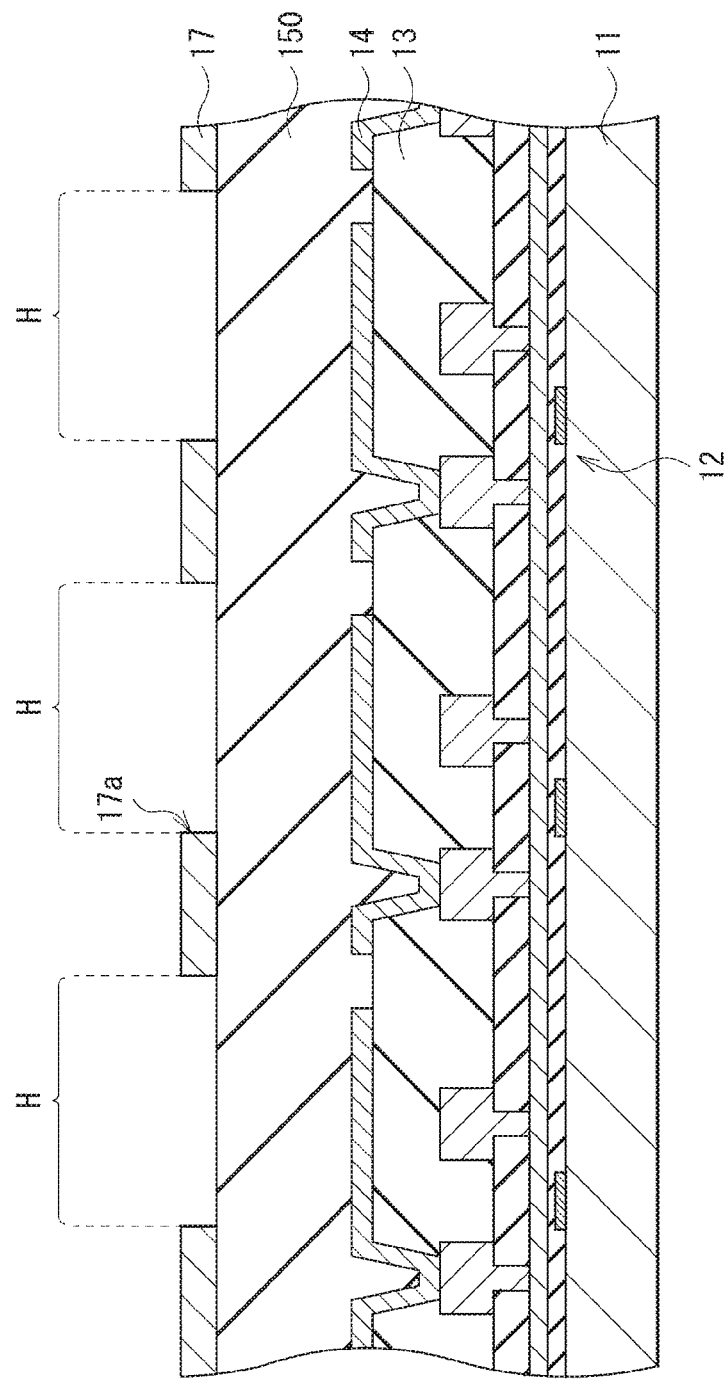
[FIG. 5F]

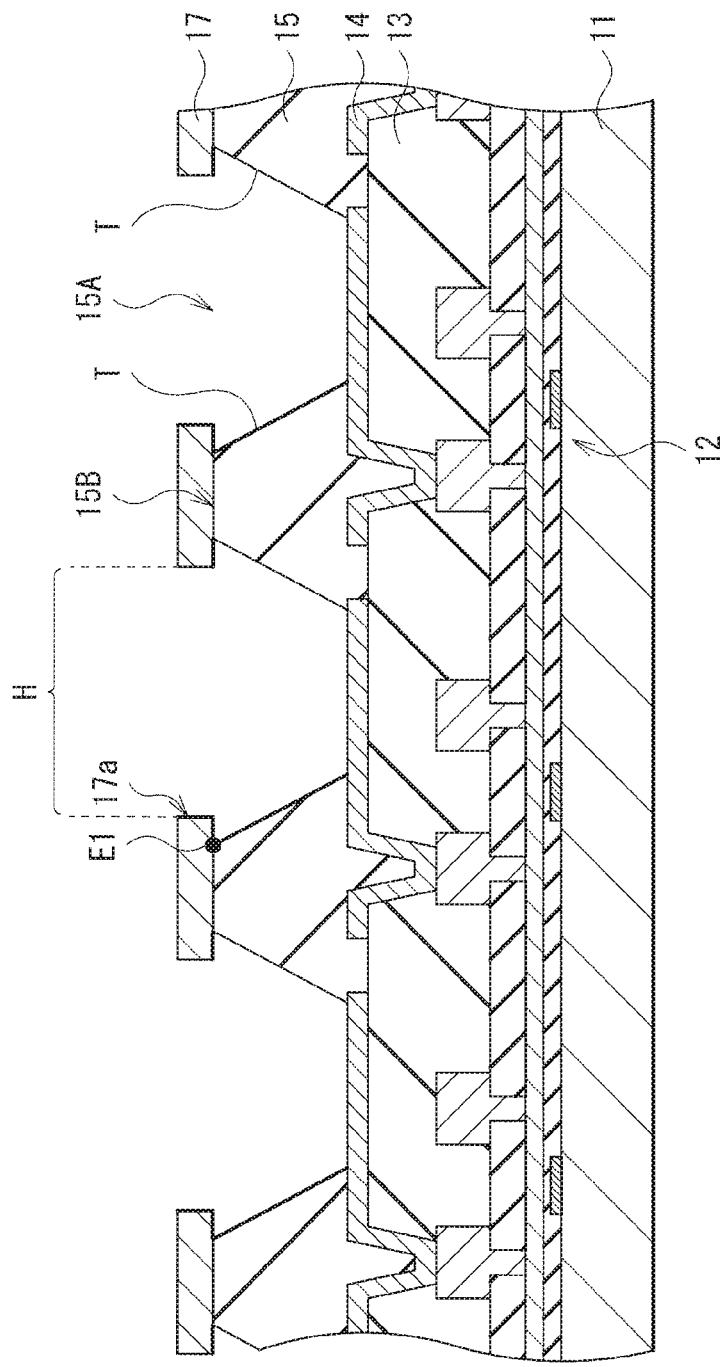
[FIG. 5G]

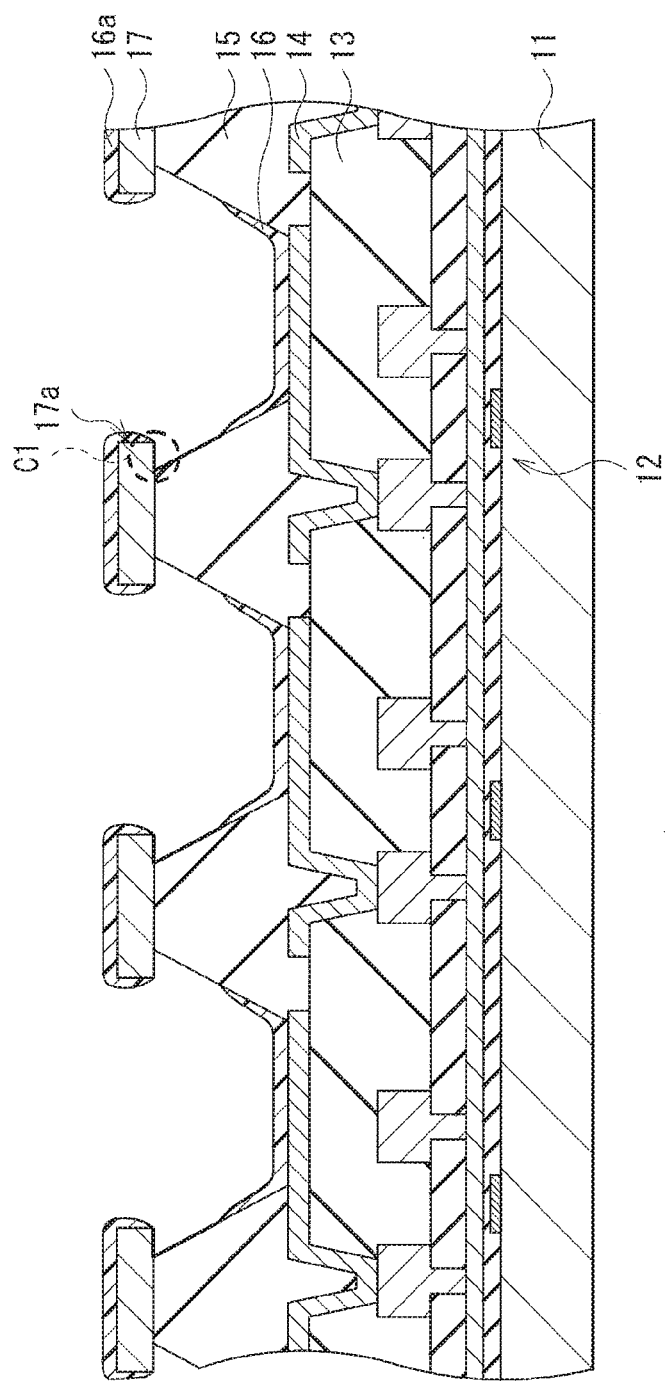
[FIG. 5H]

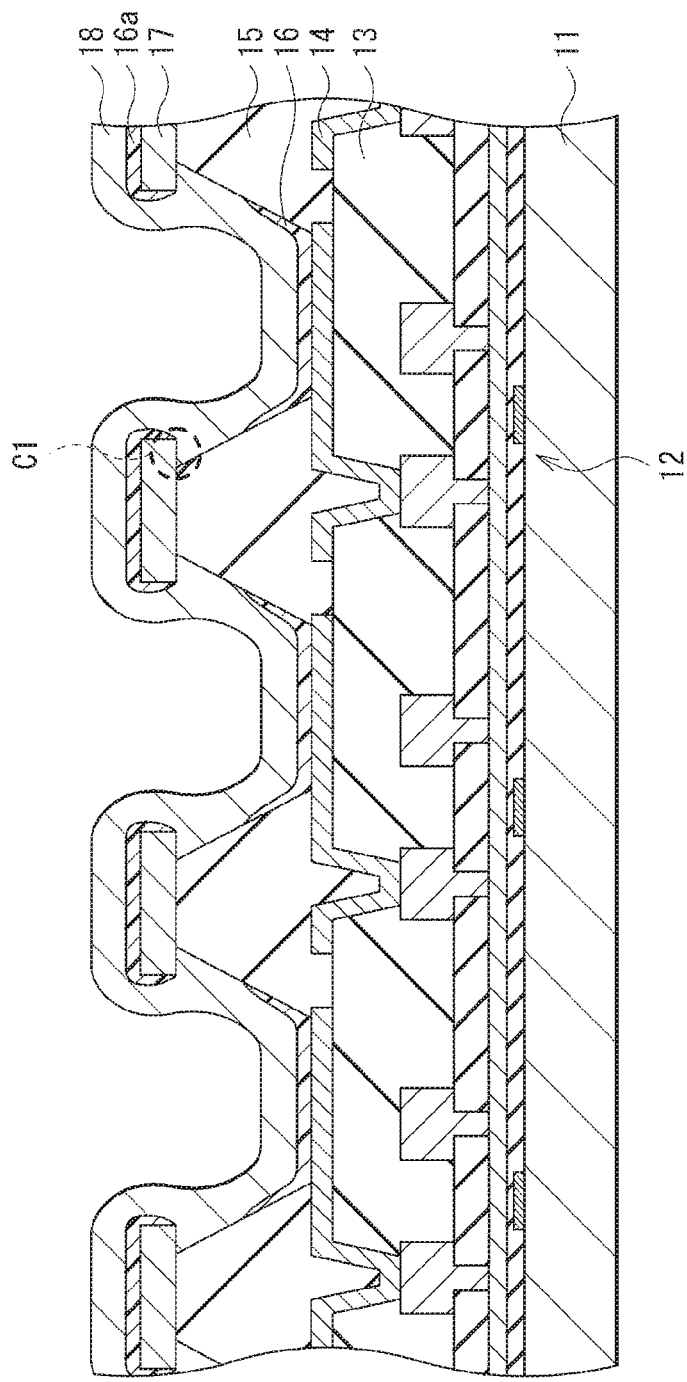
[FIG. 5I]

[FIG. 6A]
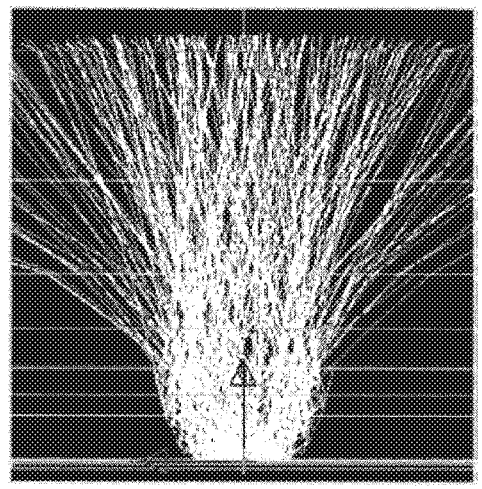
[FIG. 6B]
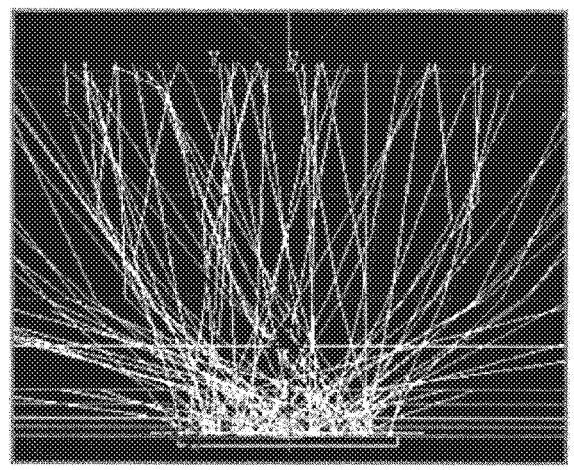

[FIG. 7A]
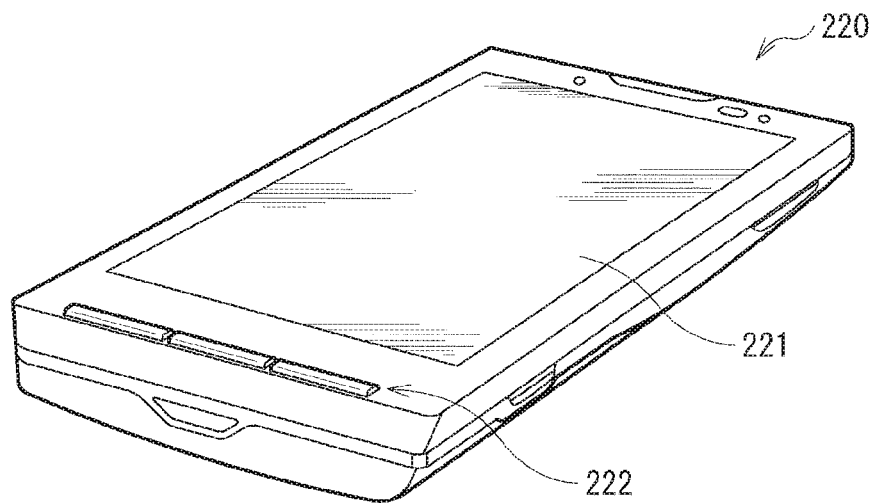
[FIG. 7B]
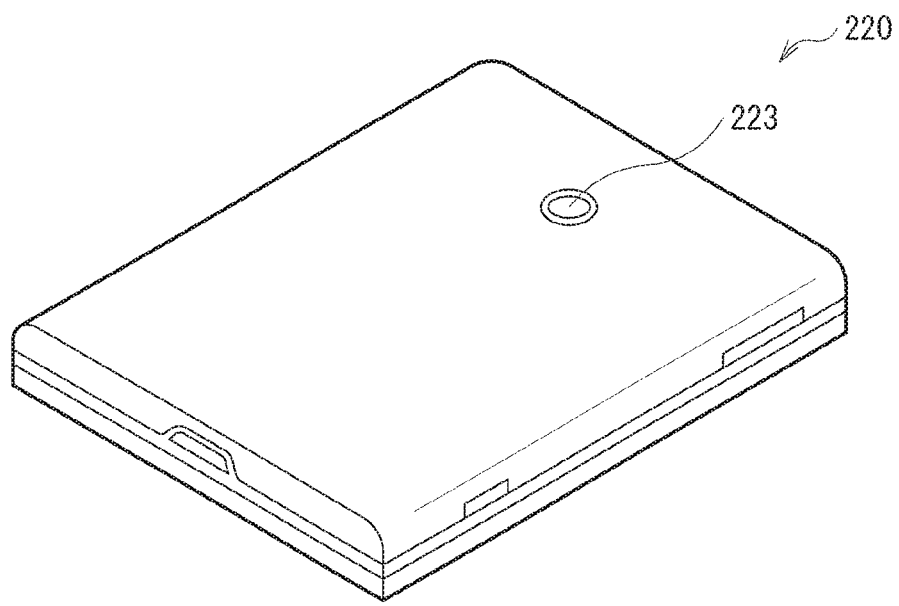

[FIG. 8]
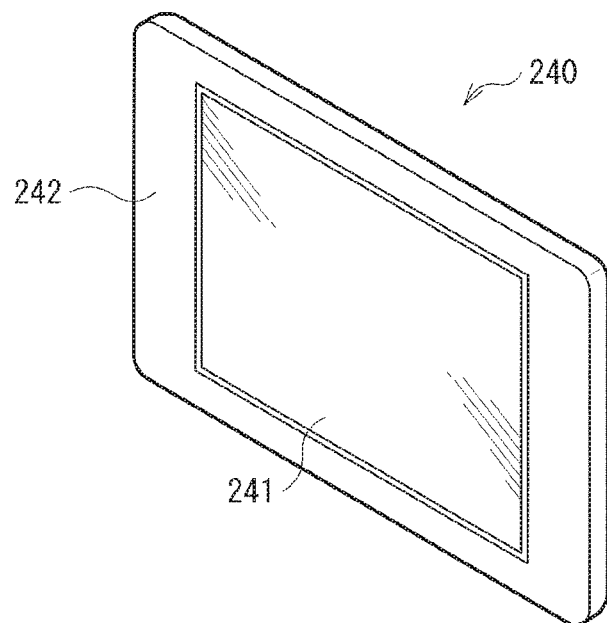
[FIG. 9]
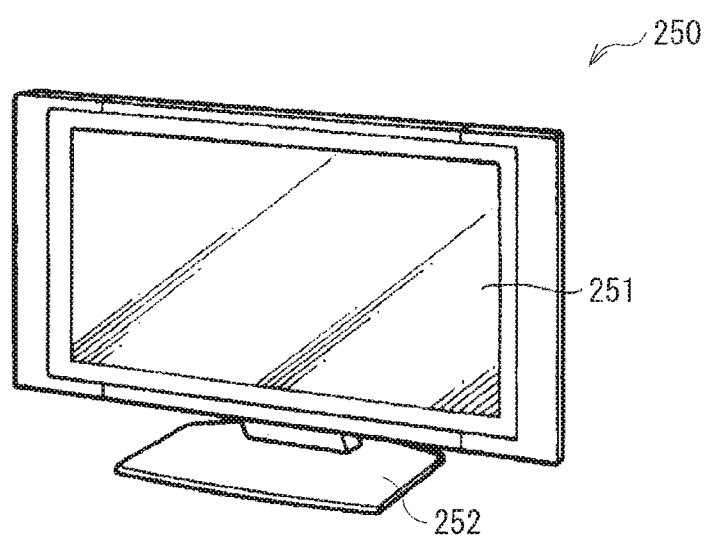

[FIG. 10A]
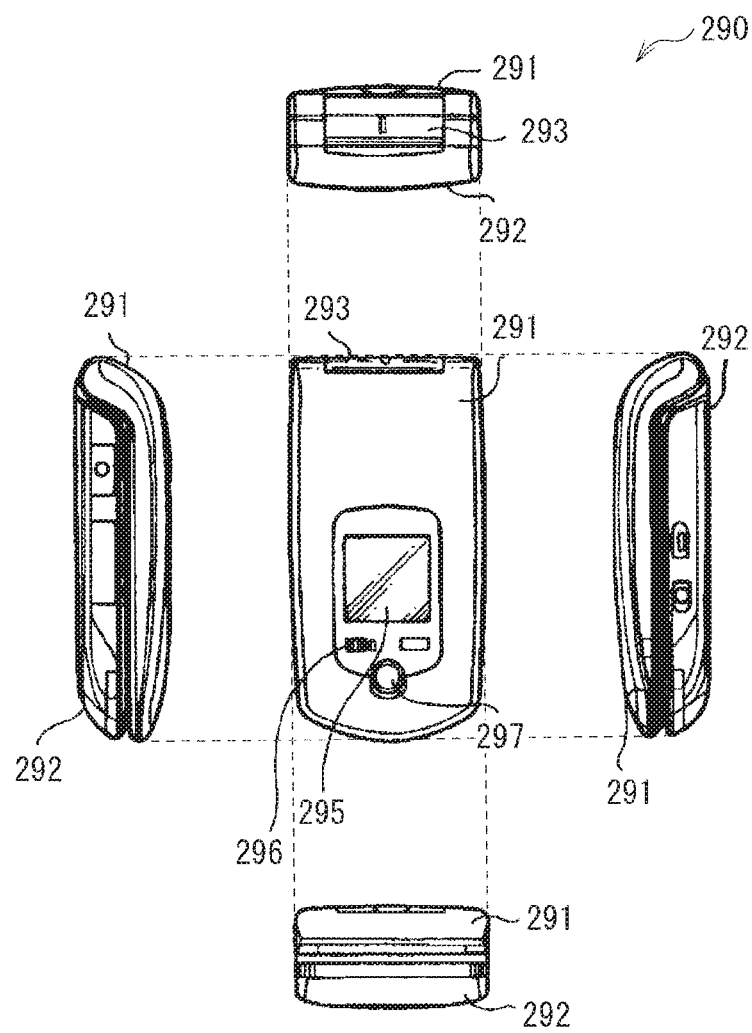

[FIG. 10B]
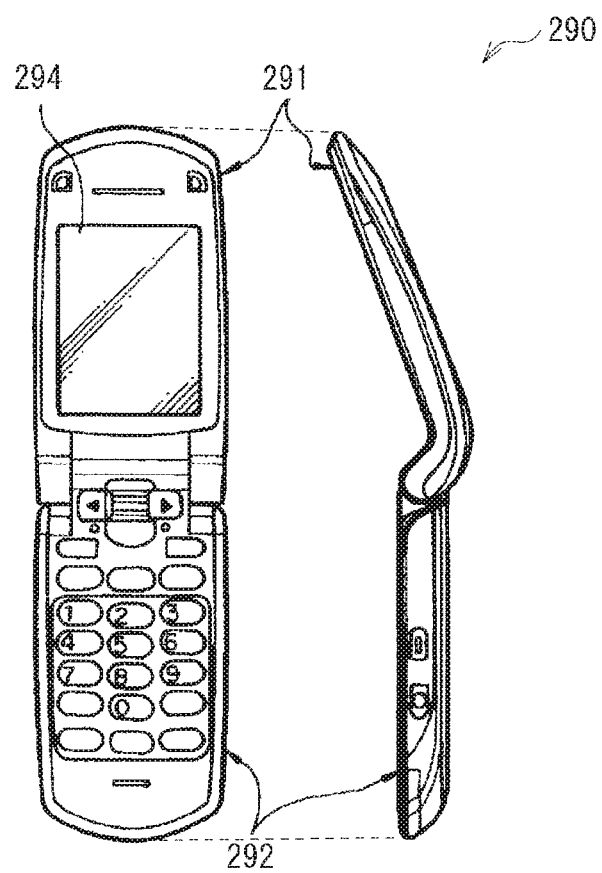

[FIG. 11A]
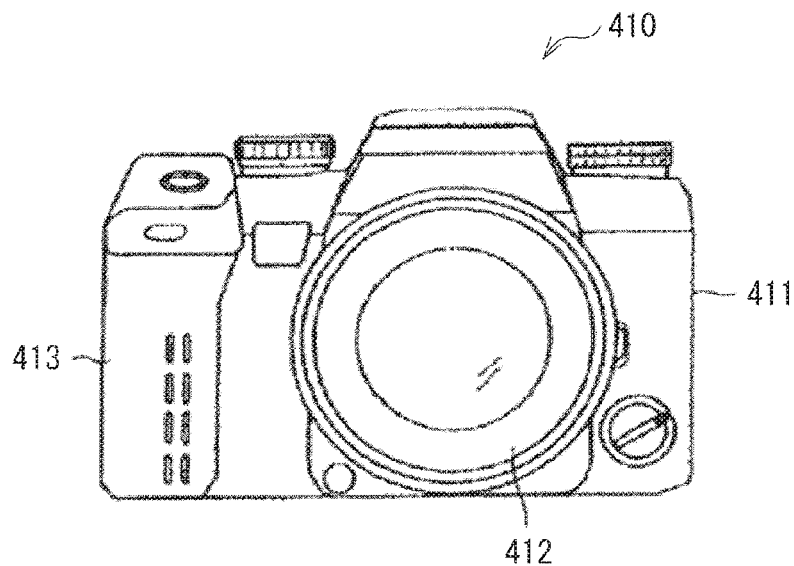
[FIG. 11B]
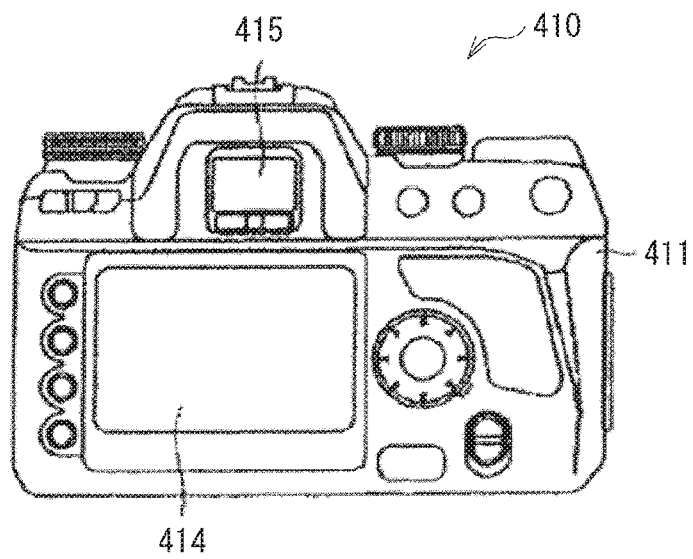

[FIG. 12]
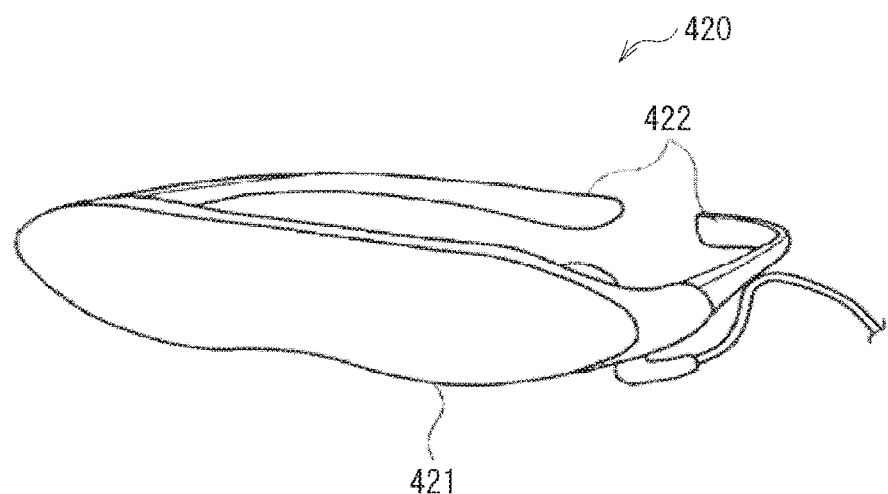
[FIG. 13A]
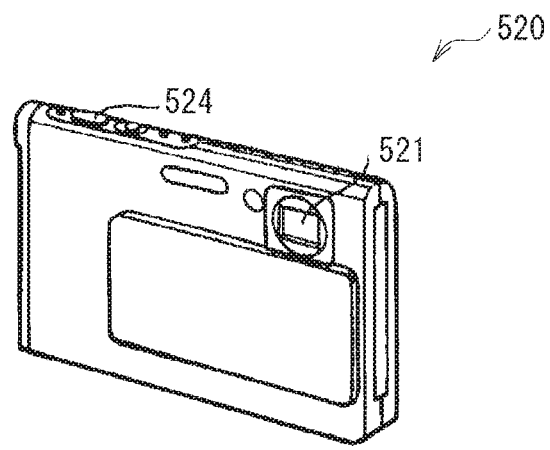
[FIG. 13B]
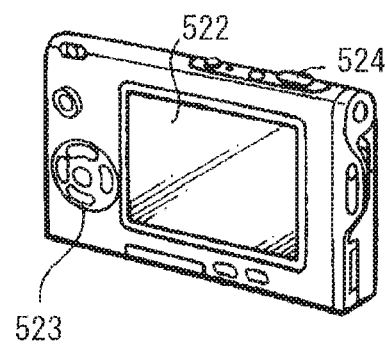

[FIG. 14]
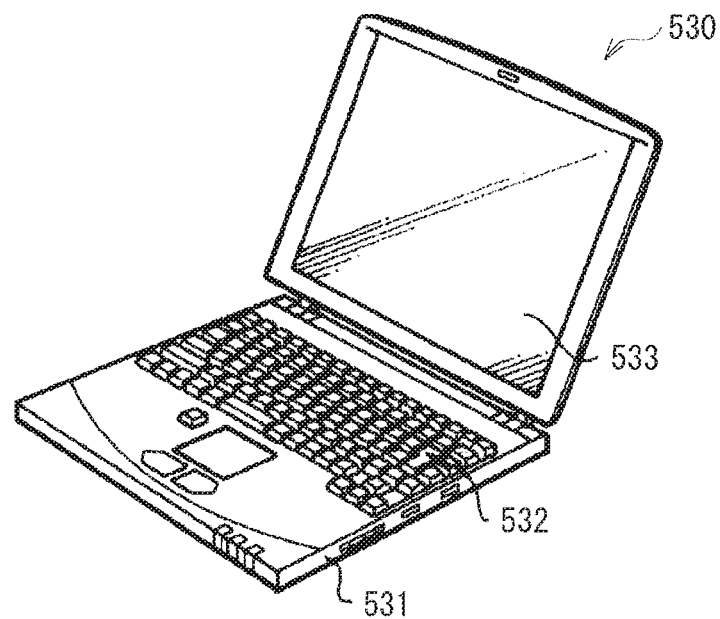
[FIG. 15]
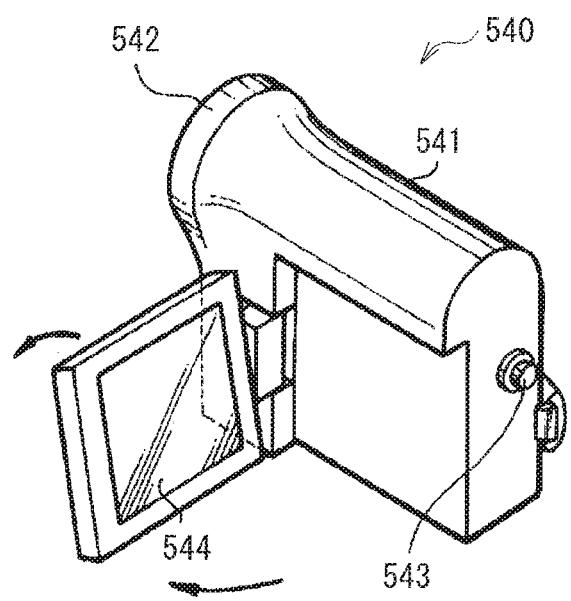

DISPLAY UNIT WITH ORGANIC LAYER

CROSS-REFERENCE TO RELATED APPLICATIONS

The present application is a continuation of U.S. patent application Ser. No. 17/988,124, filed on Nov. 16, 2022, which is a continuation of U.S. patent application Ser. No. 17/038,855, filed on Sep. 30, 2020, now U.S. Pat. No. 11,563,198, issued on Jan. 24, 2023, which is a continuation of U.S. patent application Ser. No. 16/682,135, filed on Nov. 13, 2019, now U.S. Pat. No. 10,826,023, issued on Nov. 3, 2020, which is a continuation of U.S. patent application Ser. No. 16/369,307, filed on Mar. 29, 2019, now U.S. Pat. No. 10,497,903, issued on Dec. 3, 2019, which is a continuation of U.S. patent application Ser. No. 15/512,572, filed on Mar. 19, 2017, now U.S. Pat. No. 10,290,832, issued on May 14, 2019, which is a U.S. National Phase of International Patent Application No. PCT/JP2015/076244, filed on Sep. 16, 2015, and which claims priority benefit of Japanese Patent Application No. JP 2014-208116 filed in the Japan Patent Office on Oct. 9, 2014. Each of the above-referenced application is hereby incorporated herein by reference in its entirety.

TECHNICAL FIELD

The present disclosure relates to a display unit such as an organic electroluminescence unit, a method of manufacturing the display unit, and an electronic apparatus including the display unit.

BACKGROUND ART

Recently, display units with use of an organic electroluminescence (EL) device (organic EL displays) have been increasingly developed. The display units are roughly classified into top surface emission (top emission) display units and bottom surface emission (bottom emission) display units.

In the top surface emission display unit, an upper electrode (e.g., cathode) on light extraction side is typically configured by a transparent electrically conductive film such as indium-tin oxide (ITO), thus causing resistance (cathode resistance) to be high. As a result, a voltage is dropped (occurrence of so-called voltage drop) at a middle portion of a panel, causing an increase in power consumption as well as deterioration of image quality. In this case, use of metal for the upper electrode enables the resistance to be lowered; however, metal has poor light-transmissivity. Thus, the use of metal for the upper electrode reduces light extraction efficiency, causing luminance to be lowered.

In addition, in order to lower the cathode resistance, a method may be adopted in which the transparent electrically conductive film is provided immediately on the organic electroluminescence device. However, the transparent electrically conductive film typically has a high resistance value in a thin film, and thus may desirably have increased thickness in order to lower the resistance value. When the transparent electrically conductive film has increased thickness, however, the light-transmissivity is lowered, leading to lowered luminance. As described, it is not easy for the upper electrode to both achieve light-transmissivity and electrical conductivity.

Furthermore, in order to improve the light extraction efficiency for enhancement of luminance, there has been proposed a device structure with use of a so-called anode reflector (e.g., PTL 1). More specifically, a structure body having such a sloped plane as to surround a pixel aperture is formed with use of a material having a predetermined refraction index.

CITATION LIST

Patent Literature

PTL 1: Japanese Unexamined Patent Application Publication No. 2013-191533

SUMMARY OF INVENTION

In the method using the reflector as in the above-described PTL 1, however, the upper electrode has film thickness that is decreased on the sloped plane of the structure body, making the resistance value likely to increase. In the case of using the reflector, the cathode resistance is particularly likely to be high as described above, for which an improvement is desired.

It is therefore desirable to provide a display unit that allows for reduction in power consumption while improving luminance, a method of manufacturing the display unit, and an electronic apparatus.

A display unit according to an embodiment of the present disclosure includes a plurality of pixels, a reflector layer, and an auxiliary electrode. Each of the plurality of pixels has a first electrode, an organic layer, and a second electrode in this order. The organic layer and the second electrode are provided on the first electrode. The organic layer includes a light-emitting layer. The reflector layer has a light-reflecting surface around each of the pixels. The auxiliary electrode is provided on the reflector layer and is projected from an upper end of the light-reflecting surface. The auxiliary electrode has a portion which is exposed from the organic layer, and the exposed portion is covered with the second electrode.

A method of manufacturing a display unit according to an embodiment of the present disclosure includes: forming a plurality of pixels each having a first electrode, an organic layer, and a second electrode in this order, the organic layer and the second electrode being provided on the first electrode, the organic layer including a light-emitting layer; forming a reflector layer, the reflector layer having a light-reflecting surface around each of the pixels; and forming, on the reflector layer, an auxiliary electrode that is projected from an upper end of the light-reflecting surface. The organic layer and the second electrode are formed after the forming of the reflector layer and the auxiliary electrode.

An electronic apparatus according to an embodiment of the present disclosure includes the display unit according to the embodiment of the present disclosure.

According to the display unit and the electronic apparatus of the embodiments of the present disclosure, the efficiency of extracting light emitted from the organic layer is improved by the reflector layer having a light-reflecting surface. Further, the auxiliary electrode is provided on the reflector layer and is projected from the upper end of the light-reflecting surface. In addition, a portion of the auxiliary electrode is exposed from the organic layer, and the exposed portion is covered with the second electrode. This secures electrical connection between the auxiliary electrode and the second electrode.

According to the method of manufacturing the display unit according to the embodiment of the present disclosure, the organic layer is formed after the formation of the reflector layer and the auxiliary electrode that is projected from the upper end of the light-reflecting surface of the reflector layer. This causes the auxiliary electrode to divide (disconnect) the organic layer, and thus a portion of the auxiliary electrode is exposed from the organic layer. The exposed portion is covered with the second electrode to secure the electrical connection between the auxiliary electrode and the second electrode.

According to the display unit, the method of manufacturing the display unit, and the electronic apparatus according to the embodiments of the present disclosure, the reflector layer makes it possible to improve the light extraction efficiency. Further, providing the auxiliary electrode to be projected from the upper end of the light-reflecting surface of the reflector layer makes it possible to secure the electrical connection between the auxiliary electrode and the second electrode. This makes it possible to lower a resistance value in the second electrode without increasing the film thickness of the second electrode, i.e., without reducing light-transmissivity. Thus, it becomes possible to reduce power consumption while improving luminance.

It is to be noted that that the contents described above are mere examples. The effects of the present disclosure are not limited to those described above, and may be other different effects, or may further include other effects in addition to the effects described above.

BRIEF DESCRIPTION OF THE DRAWINGS

FIG. 1A illustrates a configuration of a display unit according to a first embodiment of the present disclosure.

FIG. 1B illustrates an example of a pixel drive circuit illustrated in FIG. 1.

FIG. 2 is a cross-sectional view of the configuration of the display unit illustrated in FIG. 1.

FIG. 3 is an enlarged cross-sectional view of a portion of FIG. 2.

FIG. 4A illustrates a schematic plan view of an example of an auxiliary electrode and a reflector layer illustrated in FIG. 2.

FIG. 4B illustrates a schematic plan view of another example of the auxiliary electrode and the reflector layer illustrated in FIG. 2.

FIG. 5A is a cross-sectional view for describing a method of manufacturing the display unit illustrated in FIG. 2.

FIG. 5B is a cross-sectional view of a step subsequent to FIG. 5A.

FIG. 5C is a cross-sectional view of a step subsequent to FIG. 5B.

FIG. 5D is a cross-sectional view of a step subsequent to FIG. 5C.

FIG. 5E is a cross-sectional view of a step subsequent to FIG. 5D.

FIG. 5F is a cross-sectional view of a step subsequent to FIG. 5E.

FIG. 5G is a cross-sectional view of a step subsequent to FIG. 5F.

FIG. 5H is a cross-sectional view of a step subsequent to FIG. 5G.

FIG. 5I is a cross-sectional view of a step subsequent to FIG. 5H.

FIG. 6A is a simulation diagram for describing an effect brought by a reflector layer.

FIG. 6B is a simulation diagram for describing an effect brought by a reflector layer.

FIG. 7A is a perspective view of a configuration of a smartphone.

FIG. 7B is a perspective view of a configuration of the smartphone.

FIG. 8 is a perspective view of a configuration of a tablet personal computer.

FIG. 9 is a perspective view of a configuration of a television.

FIG. 10A is a plan view of a configuration of a mobile phone.

FIG. 10B is a plan view of a configuration of the mobile phone.

FIG. 11A is a front view of a configuration of a digital single-lens reflex camera.

FIG. 11B is a rear view of a configuration of the digital single-lens reflex camera.

FIG. 12 is a perspective view of a configuration of a head-mounted display.

FIG. 13A is a front view of a configuration of a digital still camera.

FIG. 13B is a rear view of a configuration of the digital still camera.

FIG. 14 is a perspective view of a configuration of a notebook personal computer.

FIG. 15 is a perspective view of a configuration of a video camera.

DESCRIPTION OF THE EMBODIMENTS

Some embodiments of the disclosure are described in detail below in the following order with reference to drawings.

1. Embodiment (An example of display unit including, on a reflector layer, an auxiliary electrode that is projected from a light-reflecting surface of the reflector layer)
2. Application Examples (Examples of electronic apparatuses)

Embodiment

[Configuration]

FIG. 1A illustrates a configuration of a display unit (display unit 1) according to an embodiment of the present disclosure. The display unit 1 may be an organic EL display. In a display region 110A on a first substrate 11, a plurality of pixels 10R, 10G, and 10B each including an organic EL device 10 may be disposed in matrix. The pixels 10R, 10G, and 10B emit, respectively, red light LR (wavelength of 620 nm to 750 nm both inclusive), green light LG (wavelength of 495 nm to 570 nm both inclusive), and blue light LB (wavelength of 450 nm to 495 nm both inclusive). The pixels 10R, 10G, and 10B may correspond to subpixels (R pixel, G pixel, and B pixel); for example, a combination of the R pixel, the G pixel, and the B pixel may be adopted as one pixel to perform image display. On the periphery of the display region 110A, there may be provided a signal line drive circuit 120 and a scanning line drive circuit 130 for image display.

An active drive circuit (pixel circuit 140), for example, may be provided inside the display region 110A. As illustrated in FIG. 1B, the pixel circuit 140 may include a drive transistor Tr1 and a write transistor Tr2, and a capacitor Cs may be provided between these transistors Tr1 and Tr2. The organic EL device 10 may be coupled in series to the drive transistor Tr1 between a first power supply line (Vcc) and a second power supply line (GND). The signal line drive circuit 120 may supply an image signal to source electrodes of the respective transistors Tr2 thorough a plurality of signal lines 120A arranged in a column direction. The scanning line drive circuit 130 may supply a scanning signal sequentially to gate electrodes of the respective transistor Tr2 thorough a plurality of scanning lines 130A arranged in a row direction.

FIG. 2 illustrates a cross-sectional configuration of the display unit 1 illustrated in FIG. 1A. It is to be noted that FIG. 2 illustrates regions corresponding to the respective pixels 10R, 10G, and 10B. The organic EL device 10 may be provided between the first substrate 11 and a second substrate 22. The above-described pixel circuit 140 may be provided on the first substrate 11, and a flattening layer 13 may be so provided as to cover the pixel circuit 140. On the flattening layer 13, there may be provided a first electrode 14 as an anode, for example. The first electrode 14 may be electrically coupled to the transistor Tr1 provided in the pixel circuit 140. FIG. 2 illustrates only a thin film transistor (TFT) 12 corresponding to the transistor Tr1, among the pixel circuit 140.

The organic EL device 10 may have a configuration in which the first electrode 14, an organic layer 16 including a light-emitting layer, and a second electrode 18 as a cathode, for example, are stacked in order from first substrate 11 side. The second substrate 22 may be joined onto the organic EL device 10, with a protective layer 19 and a sealing layer 20 being provided therebetween. On a surface, of the second substrate 22, which faces the first substrate 11, there may be provided a color filter layer 21 including a red filter 21R, a green filter 21G, a blue filter 21B, and a black matrix layer BM.

The display unit 1 may be, for example, a so-called top emission (top surface emission) organic EL display in which light generated in the organic layer 16 is extracted from second electrode 18 side. The organic layer 16 may have a layered structure which is common to the pixels 10R, 10G, and 10B. For example, the organic layer 16 may include a plurality of light-emitting units, and may be configured to emit white light as a whole. The white light emitted from each of the organic EL devices 10 may pass through the color filter layer 21, thus causing the red light LR, the green light LG, and the blue light LB to be emitted. Configurations of respective components are described below.

The first substrate 11 may be made of, for example, glass, a silicon (Si) wafer, a resin, or an electrically conductive substrate. Examples of available electrically conductive substrates may include a substrate whose surface is insulated with silicon oxide ($SiO_2$) or a resin, for example.

The TFT 12 may be, for example, a bottom gate thin film transistor (TFT), and may be configured by a metal oxide semiconductor field effect transistor (MOSFET), for example. In the TFT 12, for example, a gate electrode, a gate insulating film, a semiconductor thin film that forms a channel, and an interlayer insulating film may be stacked in this order on the first substrate 11; a source electrode and a drain electrode may be provided to be electrically coupled to the semiconductor thin film. The first electrode 14 may be electrically coupled to the drain electrode, for example, of the TFT 12. It is to be noted that the TFT 12 is not limited to such a bottom gate TFT; the TFT 12 may also be a top gate TFT. Further, the semiconductor thin film may also be made of, for example, a crystalline silicon or an amorphous silicon. Alternatively, the semiconductor thin film may also be made of an oxide semiconductor.

The flattening layer 13 may be provided for flattening the surface of the first substrate 11 on which the TFT 12 is provided to allow the respective layers of the organic EL device 10 to have a uniform film thickness. The flattening layer 13 may have a contact hole for electrically coupling the first electrode 14 to the drain electrode of the TFT 12, and thus may also serve to prevent the first electrode 14 from being brought into contact with the TFT 12 unnecessarily. Examples of the material for forming the flattening layer 13 may include an organic material such as a polyimide resin, an acrylic resin, and a novolac resin; and an inorganic material such as silicon oxide ($SiO_2$), silicon nitride ($SiN_x$), and silicon oxynitride (SiON).

The first electrode 14 may be provided for each pixel, and may function as an electrode that injects holes, for example, into the organic layer 16. The first electrode 14 may have light reflectivity, and may desirably have as high reflectance as possible in terms of enhancing light-emitting efficiency. Examples of the material for forming the first electrode 14 may include a metal simple substance such as silver (Ag), aluminum (Al), molybdenum (Mo), and chromium (Cr), and an alloy thereof. Further, the first electrode 14 may be either a monolayer film containing the above-mentioned metal simple substance or the alloy, or a layered film.

The organic layer 16 may include, in addition to the light-emitting layer, a hole transport layer (HTL), a hole injection layer (HIL), and an electron transport layer (ETL), for example. Further, the organic layer 16 may have a so-called tandem structure in which a plurality of light-emitting layers having different emission colors are stacked. Mixture of color light beams emitted from a plurality of stacked light-emitting layers allows for obtainment of a desired emission spectrum (e.g., white color). Examples of such a tandem structure may include a tandem structure in which a blue-light-emitting layer and a yellow-light-emitting layer are stacked, and a tandem structure in which a red-light-emitting layer, a green-light-emitting layer, and a blue-light-emitting layer are stacked. The organic layer 16 may be provided across the entire region of the display region 110A of the first substrate 11. Strictly speaking, however, the organic layer 16 may be divided at a portion of the auxiliary electrode 17; the organic layer 16 and an organic layer 16a may be provided, respectively, on the first electrode 14 and the auxiliary electrode 17. Further, while the description is given here of an example of the case where the organic layer 16 includes a plurality of stacked layers and emits white light by color mixture, the organic layer 16 may also be configured to include a single light-emitting layer (i.e., the organic layer 16 may perform single color emission).

The second electrode 18 may have light-transmissivity, and, for example, may be provided across the entire surface of the display region 110A so as to be common to all of the pixels 10R, 10G, and 10B. The second electrode 18 may be made of one or more of indium-tin oxide (ITO), indium-zinc oxide (IZO), titanium oxide (TiO), indium-gallium-zinc oxide (IGZO), zinc oxide (ZnO), aluminum-added zinc oxide (AZO), fluorine (F)-added zinc oxide (ZnO:F), fluorine-added tin oxide (FTO), and fluorine-added silicon oxide ($SiO_2$:F), for example. Alternatively, as the second electrode 18, a metal simple substance of, for example, aluminum (Al), copper (Cu), magnesium (Mg), and silver (Ag), or an alloy thereof may be used. The second electrode 18 may be formed by a sputtering method or an atomic layer deposition method, for example.

The protective layer 19 may be made of, for example, silicon nitride, silicon oxide, or a metal oxide. The sealing layer 20 may be made of, for example, a thermosetting resin or an ultraviolet-curable resin, and may function as a bonding layer.

The second substrate 22 may be made of a material such as glass transparent to respective color light beams generated in the pixels 10R, 10G, and 10B.

In the color filter layer 21, the black matrix layer BM with a light-shielding property may have apertures which face the respective organic EL devices 10. The red filter 21R, the green filter 21G, and the blue filter 21B may be provided in the respective apertures of the black matrix layer BM. The red filter 21R selectively transmits red light. The green filter 21G selectively transmits green light. The blue filter 21B selectively transmits blue light. The color filter layer 21 may be provided on either surface, of the second substrate 22, on light incident side (device side) or on light emission side; however, in this example, the color filter layer 21 is provided on the surface on the light incident side, for example. It is to be noted that, although the description is given here of an example of the configuration in which the black matrix layer BM is provided in the color filter layer 21, the black matrix layer BM may not be necessarily provided.

(Reflector Layer 15)

The display unit 1 may further have a reflector structure (so-called anode reflector) in the above-described configuration. That is, a reflector layer 15 having a light-reflecting surface (surface T described later) may be provided around each pixel. In the present embodiment, the auxiliary electrode 17 is provided on the reflector layer 15.

FIG. 3 illustrates a portion of FIG. 2 in an enlarged manner. In detail, the reflector layer 15 may have the light-reflecting surface (surface T) so as to surround each of the organic EL devices 10 (i.e., pixels 10R, 10G, and 10B). In other words, the reflector layer 15 may have a recess 15A to face each pixel, and may have a protrusion 15B at a region between the organic EL devices 10 (i.e., between pixels). The reflector layer 15 may be made of, for example, a material having a low refractive index such as silicon oxide ($SiO_2$), magnesium fluoride ($MgF_2$), lithium fluoride (LiF), a polyimide resin, an acrylic resin, a fluorine resin, a silicone resin, a fluorine-based polymer, or a silicon-based polymer. Such a configuration allows light emitted from the organic layer 16 to be reflected upward at the surface T of the recess 15A (protrusion 15B). The overall shape of the recess 15A may be, for example, an inverted truncated cone shape (circular shape in a plan view). It is to be noted that another material having a different refractive index may be embedded in the recess 15A. Further, surfaces of the recess 15A and the protrusion 15B may be covered with a film made of yet another material having a different refractive index. Furthermore, the recess 15A may have a rounded shape, in cross section, such as mortar, for example.

(Auxiliary Electrode 17)

The auxiliary electrode 17 is provided on the reflector layer 17 (adjacent to the protrusion 15B). The auxiliary electrode 17 is provided such that a portion of the auxiliary electrode 17 is projected (toward a center of the pixel) from an upper end E1 of the surface T. In other words, the upper end E1 of the surface T may be disposed at a position recessed from an end surface (inner surface of an aperture H described later) 17a of the auxiliary electrode 17. Width B of the projected portion of the auxiliary electrode 17 may be set to have a proper size such that the organic layer 16 is divided (disconnected) in a manufacturing process described later, taking into consideration thickness of the organic layer 16, thickness of the auxiliary electrode 17, thickness of the reflector layer 15, and pixel size. The width B may be adjusted depending on an etching condition when forming the reflector layer 15. Examples of the material for forming the auxiliary electrode 17 may include a metal containing one or more of titanium (Ti), molybdenum (Mo), copper (Cu), and aluminum (Al), for example. Alternatively, it is also possible to use, as the auxiliary electrode 17, a transparent electrically conductive film containing one or more of indium-tin oxide (ITO), titanium oxide (TiO), indium-zinc oxide (IZO), indium-gallium-zinc oxide (IGZO), zinc oxide (ZnO), aluminum-added zinc oxide (AZO), fluorine (F)-added zinc oxide (ZnO:F), fluorine-added tin oxide (FTO), and fluorine-added silicon oxide ($SiO_2$:F), for example.

Due to such a configuration of the auxiliary electrode 17, a portion of the auxiliary electrode 17 (more specifically, a lower surface of the projected portion of the auxiliary electrode 17; a portion C1 in FIG. 3) is exposed from the organic layer 16. The exposed portion C1 is covered with the second electrode 18. The auxiliary electrode 17 and the second electrode 18 may be electrically coupled to each other at the portion C1. It is to be noted that the organic layer 16a that is separated electrically from the organic layer 16 may be provided on the auxiliary electrode 17. The organic layer 16a may be deposited on the auxiliary electrode 17 when the organic layer 16 is formed, and may be made of the same material as that of the organic layer 16.

FIG. 4A illustrates an example of a planar arrangement (arrangement on a plane parallel to a principal plane of the first substrate 11) of the auxiliary electrode 17 and the reflector layer 15. In this manner, the recess 15A may have, for example, a circular shape in a plan view. More specifically, a planar shape formed by the upper end E1 (planar shape on upper end E1 side) S1 of the recess 15A (surface T) and a planar shape formed by a lower end E2 (planar shape on lower end E2 side) S2 thereof may each have a circular shape. The auxiliary electrode 17 may have the aperture H to face the recess 15A. The aperture shape of the aperture H may be substantially similar to the planar shape S1 of the recess 15A, and may be smaller than the planar shape S1. In this example, the aperture shape of the aperture H has a circular shape with a smaller diameter than that of the planar shape S1. The organic layer 16 may be in contact with the first electrode 14 on the lower end E2 side of the recess 15A. That is, a region corresponding to the planar shape S2 may serve as a region that contributes to light emission (pixel aperture). The auxiliary electrode 17 and the recess 15A may be provided for each pixel. As for the arrangement, the auxiliary electrode 17 and the recess 15A may be arranged in matrix in two orthogonal directions as illustrated in FIG. 4A, for examples, depending on the layout of the pixels 10R, 10G, and 10B. However, as illustrated in FIG. 4B, for example, an arrangement may also be adopted in which a portion of a row or column may be shifted in one direction with reference to the arrangement of FIG. 4A.

It is to be noted that, in this example, the circular shape is adopted as examples of the aperture shape of the aperture H of the auxiliary electrode 17 and the planar shape of the recess 15A of the reflector layer 15; however, other various shapes may be adopted in addition to the circular shape. For example, either an ellipsoidal shape or a polygonal shape such as a rectangular shape or a hexagonal shape may also be adopted. Further, an asymmetric shape or a shape having both a curve and a straight line may also be adopted. Furthermore, the shape and size of each of the aperture H and the recess 15A either may be the same among the pixels 10R, 10G, and 10B, or may be different for each of the pixels 10R, 10G, and 10B (for each of emission colors).

[Manufacturing Method]

The display unit 1 as described above may be manufactured, for example, as described below. FIGS. 5A to 5I are schematic diagrams for describing a method of manufacturing the display unit 1 of the present embodiment.

First, as illustrated in FIG. 5A, the pixel circuit 140 including the TFT 12 (only the TFT 12 is illustrated here) may be formed on the first substrate 11. For example, the gate electrode, the gate insulating film, the semiconductor layer, the interlayer insulating film, the source electrode, and the drain electrode may be formed using a known thin film process.

Subsequently, as illustrated in FIG. 5B, the flattening layer 13 may be formed to cover the TFT 12, for example, on the first substrate 11, and thereafter a contact hole 13*a* may be formed at a position corresponding to the drain electrode, for example, of the TFT 12.

(Formation of First Electrode 14)

Next, as illustrated in FIG. 5C, the first electrode 14 may be formed on the flattening layer 13. More specifically, the above-mentioned metal material may be formed on the flattening layer 13 by the vapor deposition method or the sputtering method, for example. Thereafter, etching using a photolithography method, for example, may be adopted to perform patterning for each pixel, thus forming the first electrode 14. The first electrode 14 may be electrically coupled to the TFT 12 through the contact hole 13*a*.

(Formation of Reflector Layer 15 and Auxiliary Electrode 17)

Thereafter, as illustrated in FIG. 5D, the material having the above-described refractive index (e.g., reflector material 150 made of $SiO_x$) may be formed on the first electrode 14 across the entire surface of the first substrate 11 by the vapor deposition method or the sputtering method, for example.

Subsequently, the auxiliary electrode 17 made of the above-mentioned electrically conductive material may be formed on the reflector material 150. More specifically, as illustrated in FIG. 5E, the above-mentioned electrically conductive material (e.g., titanium) may be formed on the reflector material 150 by the sputtering method, for example. Thereafter, as illustrated in FIG. 5F, the auxiliary electrode 17 may be patterned by etching using the photolithography, for example, to form a plurality of apertures H. In this case, the apertures H may be formed at positions corresponding to the respective first electrodes 14.

Next, as illustrated in FIG. 5G, the reflector material 150 may be patterned to form the reflector layer 15. More specifically, isotropic etching may be performed on the reflector material 150 using the auxiliary electrode 17 as a mask. This allows for selective removal of regions facing the respective apertures H of the auxiliary electrode 17. The reflector layer 15 may be formed which has the recess 15A and the protrusion 15B, respectively, on the first electrode 14 and at a region between the pixels. Further, the isotropic etching may allow the auxiliary electrode 17 to be formed in such a manner to be projected from the upper end E1 of the surface T (i.e., such that the upper end E1 of the surface T is disposed at a position recessed from the end surface 17*a* of the auxiliary electrode 17).

(Formation of Organic Layer 16)

Thereafter, as illustrated in FIG. 5H, the organic layer 16 may be formed. More specifically, an organic material may be formed (deposited) continuously across the entire region of the substrate 11 by a vacuum vapor deposition method, for example. Here, film formation by the vacuum vapor deposition method leads to relatively poor coverage, and is unlikely to go around below (rear side of) the projected portion of the auxiliary electrode 17. As a result, the organic layer 16 may be divided and deposited near the end surface 17*a* of the auxiliary electrode 17, and the portion (lower surface portion C1 of the projected portion) of the auxiliary electrode 17 may be exposed from the organic layer 16. Further, the organic layer 16*a* may be so deposited as to cover the upper surface of the auxiliary electrode 17.

(Formation of Second Electrode 18)

Subsequently, as illustrated in FIG. 5I, the second electrode 18 made of the above-mentioned material may be formed using the sputtering method or the atomic layer deposition (ALD) method, for example. Here, film formation by the sputtering method or the ALD method leads to relatively favorable coverage, and thus the second electrode 18 is likely to go around also below the projected portion of the auxiliary electrode 17. As a result, the second electrode 18 may also attach to the portion C1 exposed from the organic layer 16 to cover the portion C1, thus completing the film formation. This secures electrical connection between the auxiliary electrode 17 and the second electrode 18.

Lastly, although illustration is omitted, the protective layer 19 may be formed on the second electrode 18, and thereafter the second electrode 22 on which the color filter layer 21 is formed may be joined to the second electrode 18 on which the protective layer 19 is formed with the sealing layer 20 being provided therebetween. Through these steps, the display unit 1 illustrated in FIG. 2 may be completed.

[Function and Effect]

As illustrated in FIGS. 1A and 1B, in the display unit 1, a scanning signal may be supplied from the scanning line drive circuit 130 to the gate of the transistor Tr2 of each of the pixels 10R, 10G, and 10B, and an image signal may be supplied from the signal line drive circuit 120 through the transistor Tr2 to a holding capacitor Cs and held therein. Depending on the signal held in the holding capacitor Cs, the transistor Tr1 (TFT 12) may be ON/OFF controlled, thereby causing a drive current Id to be injected into the organic EL device 10 of each of the pixels 10R, 10G, and 10B. The drive current Id may be injected into the light-emitting layer of the organic layer 16 through the first electrode 14 and the second electrode 18, thus causing holes and electrons to be recombined to cause light emission.

When white light beams are generated from the respective organic EL devices 10, the respective white light beams may be transmitted through, for example, the second electrode 18 and the protective layer 19, and thereafter may be transmitted through any of the red filter 21R, the green filter 21G, and the blue filter 21B of the color filter layer 21. This may cause the respective white color beam to be converted to the red color LR, the green light LG, and the blue light LB to be emitted upward above the second electrode 22. In this manner, the display unit 1 performs image display by top surface emission.

Further, in the present embodiment, a reflector layer 15 may be provided as an anode reflector. This may cause at least a portion of light emitted from the organic layer 16 to be reflected upward (upward obliquely) as illustrated in FIG. 6A, for example, thus improving light extraction efficiency. As a result, luminance (front luminance) is improved. Furthermore, the reflector layer 15 and the auxiliary electrode 17 may serve as a wall between the pixels, thus making it possible to prevent a light beam from leaking into an adjacent pixel, which allows for suppression of color mixing. It is to be noted that, when such a reflector layer 15 is not provided, emission light may radiate in a wider range as illustrated in FIG. 6B, for example, causing a light beam to be leaked into an adjacent pixel, for example, thus leading to decreased luminance or lowered image quality.

In contrast, in the case of the top surface emission, a light-transmissive transparent electrically conductive film is used as the upper electrode (corresponding to the second electrode 18) on light extraction side, thus causing the resistance value (cathode resistance) to be increased, causing a so-called voltage drop to be likely to occur. This undesirably leads to increased power consumption or deterioration in image quality.

As opposed thereto, in the present embodiment, the auxiliary electrode 17 is provided on the reflector layer 15. The auxiliary electrode 17 is projected from the upper end of the surface T of the reflector layer 15, and a portion (portion C1) of the projected portion is exposed from the organic layer 16. The portion C1 is covered with the second electrode 18. This secures electrical connection between the auxiliary electrode 17 and the second electrode 18. As a result, a resistance value in the second electrode 18 is reduced.

As has been described above, according to the present embodiment, providing the reflector layer 15 makes it possible to improve the light extraction efficiency, thus improving luminance. Further, providing, on the reflector layer 15, the auxiliary electrode 17 to be projected from the upper end of the surface T makes it possible to secure electrical connection between the auxiliary electrode 17 and the second electrode 18. Here, the transparent electrically conductive film used for the second electrode 18 has a tendency to reduce light-transmissivity due to increased film thickness. Further, metal has excellent electrical conductivity, but has poor light-transmissivity. In the present embodiment, it is not necessary to increase the film thickness of the transparent electrically conductive film or to use metal as the second electrode 18 in order to lower the resistance value of the second electrode 18. In other words, it becomes possible to suppress voltage drop without reducing light-transmissivity. Thus, it becomes possible to reduce power consumption while improving luminance.

Application Examples

The display unit described in the foregoing embodiment and modification example is applicable to electronic apparatuses in any fields that display, as an image, an image signal input from outside or an image signal generated inside. The display unit described herein is particularly suitable for small-sized to mid-sized electronic apparatuses. The followings illustrate examples thereof.

FIGS. 7A and 7B illustrate outer appearances of a smartphone 220. The smartphone 220 may include, for example, a display section 221 and an operation section 222 on front side, and a camera 223 on rear side; the display unit 1 of the foregoing embodiment may be mounted on the display section 221.

FIG. 8 illustrates an outer appearance of a tablet personal computer 240. The tablet personal computer 240 may include, for example, a touch panel section 241 and a casing 242; the display unit 1 of the foregoing embodiment may be mounted on the touch panel section 241.

FIG. 9 illustrates an outer appearance of a television 250. The television 250 may include, for example, a main body section 251 and a stand 252. The display unit 1 according to the foregoing embodiment may be mounted on the main body section 251.

FIGS. 10A and 10B illustrate outer appearances of a mobile phone 290. The mobile phone 290 may include, for example, an upper casing 291 and a lower casing 292 joined together with a joining section (hinge section) 293, and may further include a display 294, a sub-display 295, a picture light 296, and a camera 297. The display unit 1 according to the foregoing embodiment may be mounted on the display 294 or the sub-display 295.

FIGS. 11A and 11B illustrate outer appearances of a digital single-lens reflex camera 410. The digital single-lens reflex camera 410 may include, for example, a main body 411, a lens 412, a grip 413, a display section 414, and a view finder 415. The display unit 1 according to the foregoing embodiment may be mounted on the display section 414 or the view finder 415.

FIG. 12 illustrates an outer appearance of a head-mounted display 420. The head-mounted display 420 may include, for example, a glass-shaped display section 421 and a support section 422. The display unit 1 according to the foregoing embodiment may be mounted on the display section 421.

FIGS. 13A and 13B illustrate outer appearances of a digital still camera 520. The digital still camera 520 may include, for example, a flashlight-emitting section 521, a display section 522, a menu switch 523, and a shutter button 524. The display unit 1 according to the foregoing embodiment may be mounted on the display section 522.

FIG. 14 illustrates an outer appearance of a notebook personal computer 530. The notebook personal computer 530 may include, for example, a main body 531, a keyboard 532 for operation of inputting characters, for example, and a display section 533 for displaying an image. The display unit 1 according to the foregoing embodiment may be mounted on the display section 533.

FIG. 15 illustrates an outer appearance of a video camera 540. The video camera 540 may include, for example, a main body 541, a subject-shooting lens 542 provided on a front side surface of the main body 610, a shooting start/stop switch 543 and a display section 544. The display unit 1 according to the foregoing embodiment may be mounted on the display section 544.

Although description has been given of the embodiment, the disclosure is by no means limited to the foregoing embodiment and the application examples, and various modifications are possible. For example, the shape and the arrangement of the auxiliary electrode 17 are not limited to those described above, and various other configurations may be adopted. Although the foregoing embodiment and the application examples exemplify the case where the aperture shape of the aperture H of the auxiliary electrode 17 is substantially similar to the planar shape S1 of the recess 15A of the reflector layer 15 in a plan view; however, these shapes may not be necessarily similar. It is sufficient for the auxiliary electrode to be formed to be projected from the upper end of the light-reflecting surface of the reflector layer; the aperture shape of the auxiliary electrode is not particularly limited. Further, although a single auxiliary electrode may be provided, a plurality of auxiliary electrodes may also be provided. However, when the reflector layer 15 is formed by etching using the auxiliary electrode 17 as a mask, as in the foregoing embodiment, the aperture shape of the auxiliary electrode 17 may be substantially similar to the planar shape of the recess 15A of the reflector layer 15.

Further, in the foregoing embodiment, the recess 15A of the reflector layer 15 may be formed by the isotropic etching using the auxiliary electrode 17 as a mask; however, the method for forming the recess 15A is not limited thereto. For example, a combination of a plurality of anisotropic etchings may also be adopted. As one example thereof, the reflector material may be etched in a thickness direction (vertical direction), and thereafter may be etched in an intra-plane direction (lateral direction) to allow for formation of a structure similar to that in the case of the isotropic etching.

Further, other masks (such as a photoresist), instead of the auxiliary electrode as a mask, may also be used to perform etching.

Moreover, the material and thickness of each layer are not limited to those listed in the foregoing embodiment and the application examples; each layer may be made of any other material with any other thickness. Further, it is not necessary for the display unit to include all of the above-described layers; alternatively, yet another layer may also be included in addition to each of the above-described layers. It is to be noted that the effects described in the foregoing embodiment and the application examples are mere examples, and the effects of the present disclosure may be other different effects, or may further include other effects.

It is to be noted that the disclosure may also have the following configurations.

(1)
A display unit including:
a plurality of pixels each having a first electrode, an organic layer, and a second electrode in this order, the organic layer and the second electrode being provided on the first electrode, the organic layer including a light-emitting layer;
a reflector layer having a light-reflecting surface around each of the pixels; and
an auxiliary electrode that is provided on the reflector layer and is projected from an upper end of the light-reflecting surface, the auxiliary electrode having a portion which is exposed from the organic layer, the exposed portion being covered with the second electrode.

(2)
The display unit according to (1), wherein
the reflector layer has a plurality of recesses each having the light-reflecting surface, the plurality of recesses facing the respective pixels,
the auxiliary electrode has a plurality of apertures that face the respective recesses, and
an aperture shape of each of the apertures in the auxiliary electrode is smaller than a shape of each of the recesses on upper end side in a plan view.

(3)
The display unit according to (2), wherein the shape of each of the recesses is substantially similar to the aperture shape of each of the apertures.

(4)
The display unit according to (3), wherein the aperture shape of each of the apertures is smaller than the shape of each of the recesses.

(5)
The display unit according to any one of (1) to (4), further including another organic layer that is provided on the auxiliary electrode and contains a material same as a material of the organic layer.

(6)
The display unit according to any one of (1) to (5), wherein the reflector layer contains silicon oxide ($SiO_x$), magnesium fluoride ($MgF_2$), lithium fluoride (LiF), a polyimide resin, an acrylic resin, a fluorine resin, a silicone resin, a fluorine-based polymer, or a silicon-based polymer.

(7)
The display unit according to any one of (1) to (6), wherein the auxiliary electrode contains one or more of titanium (Ti), molybdenum (Mo), copper (Cu), and aluminum (Al).

(8)
The display unit according to any one of (1) to (6), wherein the auxiliary electrode contains one or more of indium-tin oxide (ITO), titanium oxide (TiO), indium-zinc oxide (IZO), indium-gallium-zinc oxide (IGZO), zinc oxide (ZnO), aluminum-added zinc oxide (AZO), fluorine (F)-added zinc oxide (ZnO:F), fluorine-added tin oxide (FTO), and fluorine-added silicon oxide ($SiO_2$:F).

(9)
The display unit according to any one of (1) to (8), wherein the light-emitting layer included in the organic layer includes a single light-emitting layer or a plurality of stacked light-emitting layers.

(10)
A method of manufacturing a display unit, the method including:
forming a plurality of pixels each having a first electrode, an organic layer, and a second electrode in this order, the organic layer and the second electrode being provided on the first electrode, the organic layer including a light-emitting layer;
forming a reflector layer, the reflector layer having a light-reflecting surface around each of the pixels;
forming, on the reflector layer, an auxiliary electrode that is projected from an upper end of the light-reflecting surface; and
forming the organic layer and the second electrode after the forming of the reflector layer and the auxiliary electrode.

(11)
The method of manufacturing the display unit according to (10), wherein the reflector layer is formed by performing isotropic etching that uses the auxiliary electrode as a mask, after the auxiliary electrode is formed on the first electrode with a reflector material being provided therebetween.

(12)
The method of manufacturing the display unit according to (10) or (11), wherein the second electrode is formed by a sputtering method or an atomic layer deposition (ALD) method.

(13)
An electronic apparatus including a display unit, the display unit including:
a plurality of pixels each having a first electrode, an organic layer, and a second electrode in this order, the organic layer and the second electrode being provided on the first electrode, the organic layer including a light-emitting layer;
a reflector layer having a light-reflecting surface around each of the pixels; and
an auxiliary electrode that is provided on the reflector layer and is projected from an upper end of the light-reflecting surface, the auxiliary electrode having a portion which is exposed from the organic layer, the exposed portion being covered with the second electrode.

This application is based upon and claims the benefit of priority of the Japanese Patent Application No. 2014-208116 filed with the Japan Patent Office on Oct. 9, 2014, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A display unit, comprising:
    a substrate;
    a plurality of pixel circuits arranged on the substrate;
    a planarization layer arranged on the plurality of pixel circuits; and
    a plurality of light emitting elements disposed on the planarization layer, wherein the plurality of light emitting elements include at least three light emitting elements,
    wherein each of the plurality of light emitting elements include a first electrode, an organic layer, and a second electrode, and the organic layer is commonly provided for each of the three light emitting elements,
    an insulation layer is disposed on the first electrode,
    a metal layer is disposed on the insulation layer,
    a first part of the organic layer is disposed between the metal layer and the second electrode,
    a second part of the organic layer is disposed between the first electrode and the second electrode and between a side surface of the insulation layer and the second electrode, and
    a width of a bottom surface of the metal layer is wider than a width of an upper surface of the insulation layer.

2. The display unit of claim 1, wherein the insulation layer is a reflector.

3. The display unit of claim 1, wherein the metal layer is an auxiliary electrode.

4. The display unit of claim 1, wherein the organic layer comprises a plurality stacked layers.

5. The display unit of claim 1, wherein the second electrode is formed by sputtering or atomic layer deposition (ALD).

6. The display unit of claim 1, wherein the second electrode is made of one or more of indium-tin oxide (ITO), indium-zinc oxide (IZO), titanium oxide (TiO), indium-gallium-zinc oxide (IGZO), zinc oxide (ZnO), aluminum-added zinc oxide (AZO), fluorine (F)-added zinc oxide (ZnO:F), fluorine-added tin oxide (FTO), and fluorine-added silicon oxide (SiO2:F).

7. The display unit of claim 1, wherein the second electrode is made of a metal comprising aluminum (Al), copper (Cu), magnesium (Mg), silver (Ag), or an alloy thereof.

8. The display unit of claim 1, wherein the metal layer is made of a metal comprising titanium (Ti), molybdenum (Mo), copper (Cu), or aluminum (Al).

9. The display unit of claim 1, wherein the first electrode is made of a metal comprising silver (Ag), aluminum (Al), molybdenum (Mo), chromium (Cr), or an alloy thereof.

10. The display unit of claim 9, wherein the first electrode is made of a monolayer film.

11. The display unit of claim 9, wherein the first electrode is made of a layered film.

* * * * *